United States Patent
Okikawa et al.

[19]

[11] Patent Number: 6,032,362
[45] Date of Patent: Mar. 7, 2000

[54] METHOD FOR PRODUCING A HEAT SPREADER AND SEMICONDUCTOR DEVICE WITH A HEAT SPREADER

[75] Inventors: Susumu Okikawa, Tokyo; Saburou Kitaguchi, Kanagawa-ken, both of Japan

[73] Assignees: Hitachi Metals, Ltd.; Nippon Steel Corporation, both of Tokyo, Japan

[21] Appl. No.: 09/070,847

[22] Filed: May 1, 1998

Related U.S. Application Data

[62] Division of application No. 08/694,790, Aug. 9, 1996, Pat. No. 5,844,310.

[51] Int. Cl.⁷ ..................................................... B23P 15/26
[52] U.S. Cl. ............................... 29/890.03; 29/890.039; 29/890.054
[58] Field of Search ..................... 29/890.03, 890.054, 29/890.039, 428; 257/675, 712

[56] References Cited

U.S. PATENT DOCUMENTS 4,810,563  3/1989  DeGree et al. .
5,681,663  10/1997  Schaller et al. .

FOREIGN PATENT DOCUMENTS 1-89351    4/1989   Japan .
4-99051    3/1992   Japan .
6-21287    1/1994   Japan .
6/163737   6/1994   Japan .
7-211818   8/1995   Japan .
7-302866  11/1995   Japan .

*Primary Examiner*—Irene Cuda
*Attorney, Agent, or Firm*—Finnegan, Henderson, Farabow, Garrett, and Dunner, L.L.P.

[57]  ABSTRACT

A heat spreader for a semiconductor device is constituted by an integral laminate of alternatingly stacked and diffusion-bonded Fe—Ni alloy sheets and copper-group metal sheets, the laminate having a one-directional stripe pattern of the Fe—Ni alloy sheets and the copper-group metal sheets, which appears on a planar surface on which a silicon chip is disposed. It is produced by (a) alternatingly stacking Fe—Ni alloy sheets and copper-group metal sheets, (b) hot isostatic-pressing the resulting stack of the metal sheets to form a slab, (c) rolling the slab vertically to the laminating direction of the metal sheets to form an integrated stripe-pattern laminate, and (d) cutting the integrated stripe-pattern laminate to a predetermined shape.

5 Claims, 21 Drawing Sheets

FIG. 20(c)　　FIG. 20(b)　　FIG. 20(a)
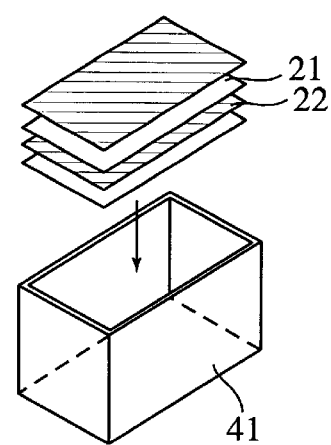
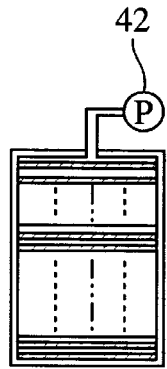
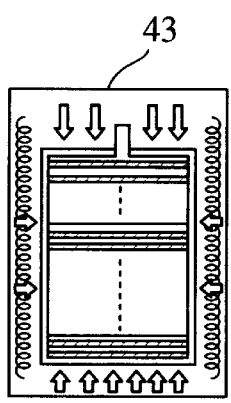
FIG. 20(d)　　　　　FIG. 20(e)
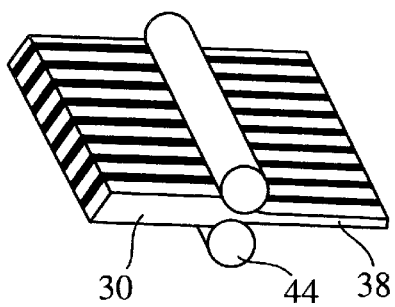　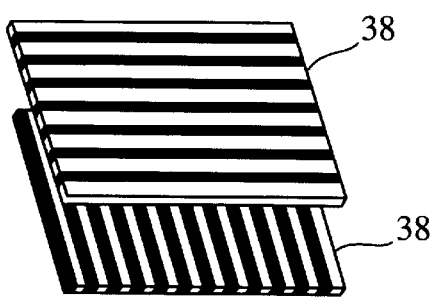
FIG. 20(f)　　　　　FIG. 20(g)
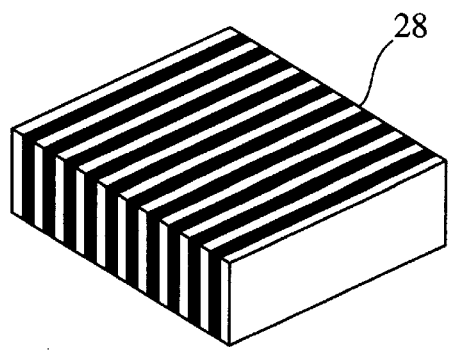　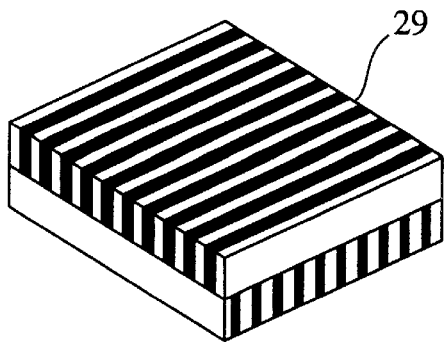

or

METHOD FOR PRODUCING A HEAT SPREADER AND SEMICONDUCTOR DEVICE WITH A HEAT SPREADER

This is a division of application Ser. No. 08/694,790, filed Aug. 9, 1996, now U.S. Pat. No. 5,844,310.

BACKGROUND OF THE INVENTION

The present invention relates to a heat spreader for semiconductor devices with excellent heat dissipation and a small difference in thermal expansion from an Si chip without peeling from a resin or ceramic package even at larger heat generation due to higher integration of chip circuits, a semiconductor device including such a heat spreader, and a method for producing such a heat spreader.

Since more and more heat is generated from semiconductor devices due to increasingly higher integration of circuits, semiconductor devices are provided with heat spreaders to dissipate heat therefrom. A typical example of such semiconductor devices is shown in FIGS. 1–5. FIG. 1 shows a semiconductor device in which a silicon chip 1 is bonded to a heat spreader 2 with a bonding material layer 6 and embedded in a resin (plastic) 8. A plurality of leads of the semiconductor device are connected to a circuit board 10 via a solder layer 9. The heat of the silicon chip 1 is conducted to the heat spreader 2 via a bonding material layer 6 made of a silver paste, etc. and dissipated to the circuit board 10 via a bonding material layer 7 and an inner lead portion 3a and an outer lead portion 3b of each lead. The heat spreader 2 may also be called "heat sink" or "header."

FIG. 2 shows a semiconductor device having a resin 8 from which a heat spreader 2 is exposed to perform heat dissipation. FIG. 3 shows a semiconductor device provided with a heat spreader 2 having a heat dissipation fin member 12 bonded thereto by a bonding material layer 11 to exhibit increased heat dissipation. In the semiconductor device structures described above, the circuits on the silicon chip 1 are connected to an outside circuit board 10 via bonding wires 5, and inner lead portions 3a and outer lead portions 3b of lead frame 3.

FIG. 4 shows an example of a ball grid array (BGA) type plastic package. A circuit of a printed circuit board substrate 13 is connected to a silicon chip 1 via bonding wires 5 and also is connected to an outside circuit via ball bumps 14. Bonding wires 5 are sealed by a resin 8. A heat generated from the silicon chip 1 is dissipated from a heat dissipation fin member 12 via a heat spreader 2. FIG. 5 shows an example of a ceramic package for a silicon chip. The silicon chip 1 is connected to pins 17 mounted to a ceramic substrate 15 via bonding wires 5, and the pins 17 are connected to an outside circuit. The bonding wires 5 are protected by a cap 16. A heat generated from the silicon chip 1 is dissipated from a heat dissipation fin member 12 via a heat spreader 2.

In various types of semiconductor devices as described above, the heat spreaders 2 are preferably made of materials having high thermal conductivity. A more important factor for the heat spreaders 2 is a thermal expansion coefficient. Accordingly, in actual semiconductor devices, materials for heat spreaders are selected from metals and sintered metals having low thermal expansion coefficients close to that of Si depending on the types of the semiconductor devices, taking into account thermal strain in a solder reflow treatment during the mounting process and in a T cycle heat hysteresis test at a temperature of from −55° C. to +150° C. In semiconductor devices with plastic packages, 42% Ni—Fe alloy (42 alloy) is widely used for heat spreaders. In semiconductor devices with ceramic packages, sintered metals of Cu—Mo, Cu—W, Mo, etc. are used for heat spreaders. These materials, however, are poor in machinability and platability and disadvantageous in cost and weight.

OBJECT AND SUMMARY OF THE INVENTION

Accordingly, an object of the present invention is to provide a heat spreader for a semiconductor device having excellent heat dissipation with small difference in thermal expansion coefficient from a silicon chip and without peeling from plastic or ceramic packages, thereby protecting the semiconductor devices from increased heat generation of more integrated circuits on silicon chips.

Another object of the present invention is to provide a semiconductor device provided with such a heat spreader.

A further object of the present invention is to provide a method for producing such a heat spreader.

According to the first embodiment of the invention, the heat spreader for a semiconductor device comprises an integral laminate of alternatingly stacked and diffusion-bonded Fe—Ni alloy sheets and copper-group metal sheets, the laminate having a one-directional stripe pattern of the Fe—Ni alloy sheets and the copper-group metal sheets, which appears on a planar surface on which a silicon chip is disposed. A stripe interval determined by a pair of an Fe—Ni alloy sheet and a copper-group metal sheet is preferably 1 mm or less. The stripe pattern preferably crosses side edges of the heat spreader.

Two or more integral laminates of the Fe—Ni alloy sheets and the copper-group metal sheets are preferably stacked and bonded together such that stripe directions of the integral laminates are perpendicular to each other. The heat spreader is preferably constituted by two integral laminates of the Fe—Ni alloy sheets and the copper-group metal sheets stacked vertically to the laminating direction of each integral laminate, a thickness ratio of the upper integral laminate to the lower integral laminate being $1/1.5$–$1/3$.

Two or more integral laminates of the Fe—Ni alloy sheets and the copper-group metal sheets are preferably stacked in a stepped manner. Also, the chip-bearing surface of the integral laminate is preferably covered with a copper-group metal layer.

According to the second embodiment of the invention, the heat spreader for a semiconductor device comprises a center portion made of an Fe—Ni alloy, an outer portion made of a copper-group metal, and a peripheral portion made of titanium, each portion penetrating from a chip-bearing surface to the opposite surface. A peripheral of the integral laminate is preferably covered with a titanium layer.

According to the third embodiment of the invention, the semiconductor device comprises a heat spreader constituted by an integral laminate of alternatingly stacked and diffusion-bonded Fe—Ni alloy sheets and copper-group metal sheets, the laminate having a one-directional stripe pattern of the Fe—Ni alloy sheets and the copper-group metal sheets, which appears on a planar surface on which a silicon chip is disposed.

According to the fourth embodiment of the invention, the semiconductor device comprises a heat spreader comprising a center portion made of an Fe—Ni alloy, an outer portion made of a copper-group metal, and a peripheral portion made of titanium, each portion penetrating from a chip-bearing surface to the opposite surface.

According to the fifth embodiment of the invention, there is provided a method for producing a heat spreader for a semiconductor device comprising the steps of (a) alternatingly stacking Fe—Ni alloy sheets and copper-group metal sheets, (b) hot isostatic-pressing the resulting stack of the metal sheets to form a slab, (c) rolling the slab vertically to the laminating direction of the metal sheets to form an integrated stripe-pattern laminate, and (d) cutting the integrated stripe-pattern laminate to a predetermined shape.

A laminate of alternatingly stacked Fe—Ni alloy sheets and copper-group metal sheets is preferably inserted into a capsule constituted by an outer steel wall and an inner Cu wall and subjected to hot isostatic pressing, followed by the removal of the outer steel wall from the resultant hot isostatic-pressed capsule to provide a slab covered by a copper layer.

The method preferably comprises the steps of cutting the slab to a rectangular parallelepiped shape, stacking two or more cut slabs with their stripe directions perpendicular to each other, subjecting the stacked slabs to hot isostatic pressing again to form a composite slab, rolling the composite slab vertically to the laminating direction of one slab to form an integrated composite laminate, and cutting the integrated composite laminate to a predetermined shape. Two or more rolled stripe-pattern laminates are preferably stacked with their stripe directions perpendicular to each other and bonded together by hot pressing or brazing, and cut to a predetermined shape.

According to the sixth embodiment of the invention, there is provided a method for producing a heat spreader for a semiconductor device comprising the steps of inserting a solid cylindrical body made mainly of an Fe—Ni alloy into a hollow cylindrical body made of a Cu-group metal, hot-extruding the resultant composite body, and cutting the hot-extruded composite body transversely.

According to the seventh embodiment of the invention, there is provided a method for producing a heat spreader for a semiconductor device comprising the steps of stacking a Cu-group metal body to each side surface of an Fe—Ni alloy body in the shape of a rectangular parallelepiped, hot isostatic pressing the resultant stack of the Fe—Ni alloy body and the Cu-group metal body to provide a slab, rolling the slab vertically to the laminating direction of the slab, and cutting the resultant integrated laminate to a predetermined shape.

BRIEF DESCRIPTION OF THE DRAWINGS

FIGS. 20(a)–(g) are schematic views showing the production process of a heat spreader according to one embodiment of the present invention;

DETAILED DESCRIPTION OF THE PREFERRED EMBODIMENTS

[1] Heat Spreader (A) First Heat Spreader

Figure 6:
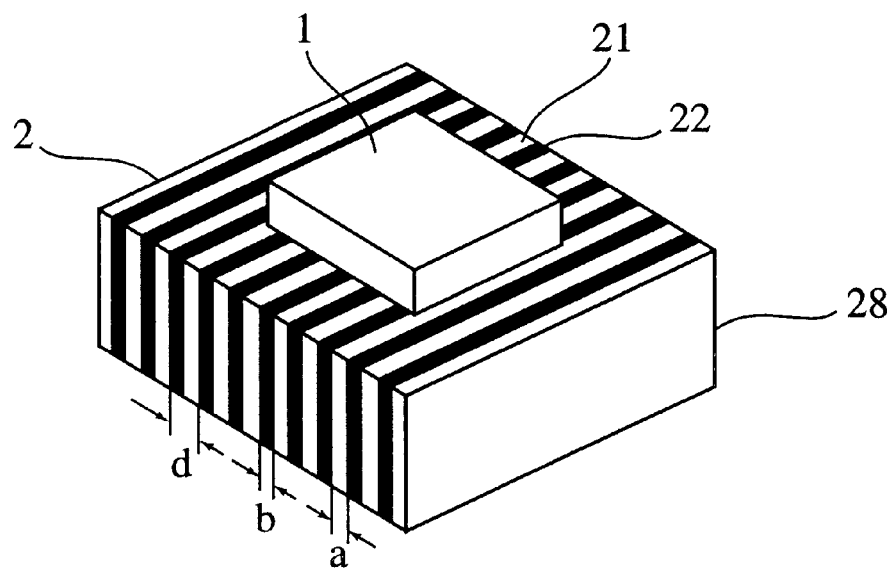
FIG. 6 is a perspective view showing a heat spreader according to one embodiment of the present invention.

The first heat spreader is shown in FIGS. 6–11. In the figures except for FIG. 9, the silicon chip 1 is mounted to the heat spreader 2. As is shown in FIG. 6, the heat spreader 2 is a stripe-pattern laminated metal body 28 constituted by alternatingly stacking Fe—Ni alloy sheets 21 and Cu-group metal sheets 22 for providing a surface having a stripe pattern of the alternatingly stacked sheets on which a silicon chip is supported. The Fe—Ni alloy sheets 21 are made of alloys with small thermal expansion coefficients such as 42% Ni—Fe alloys, invar containing 35–37% Ni, etc., and the Cu-group metal sheets 22 are made of alloys with such a large thermal conductivity as about 393 W/mK±10%, such as Cu or Cu alloys such as Cu—P, Cu—Sn, etc.

Since the first heat spreader is a laminate constituted by the Fe—Ni alloy sheets 21 and the Cu-group metal sheets 22 in the above manner, heat is well conducted from the side to which the silicon chip is mounted to the other side. By adjusting the ratio of the Fe—Ni alloy sheets to the Cu-group metal sheets, it is possible to control the thermal conductivity of the laminate to higher than a required level while keeping the thermal expansion coefficient of the laminate close to that of Si. Accordingly, even though heat generation is increased due to higher integration of circuits on silicon chips 1 in various semiconductor devices, the heat spreader can keep excellent heat dissipation, while avoiding the likelihood that the silicon chips 1 are broken or peel off from the heat spreader due to the difference in thermal expansion. Also, since the Fe—Ni alloy is well wet with resins, there is no likelihood of peeing of the plastic package from the heat spreader comprising the Fe—Ni alloy sheets and cracking of the plastic package. Further, the heat spreader has a thermal expansion coefficient close to those of ceramics, it does not suffer from thermal strain due to brazing and die bonding in the ceramic packages.

Since the heat spreader has a thermal conductivity and a thermal expansion coefficient varying depending on the ratio of the Fe—Ni alloy sheets 21 to the Cu-group metal sheets 22, the desired ratio range of the Fe—Ni alloy sheets 21 to the Cu-group metal sheets 22 can be found first by determining the lower limit of the thermal conductivity suitable for the power of the silicon chip 1 and the type, shape and use conditions of the semiconductor device, and then by determining the upper limit of the thermal expansion coefficient suitable for the size of the chip 1, the materials of the package (resins or ceramics) and the use conditions of the semiconductor device, and finally by considering both the lower limit of the thermal conductivity and the upper limit of the thermal expansion coefficient.

In the heat spreader as shown in FIG. 6, the interval d of stripes shown in FIG. 6 is preferably 0.1–2.0 mm, the width a of each Fe—Ni alloy sheet 21 is preferably 0.05–1.0 mm, and the width b of each Cu-group metal sheet 22 is 0.05–1.0 mm. To uniformly conduct the heat generated from the chip 1 to the heat spreader 2, it is preferable that the chip 1 is in as uniform contact with the Cu-group metal sheets 22 as possible. Also, to suppress local thermal strain as much as possible, it is preferable that the heat spreader 2 has as uniform a thermal expansion coefficient as possible. For these purposes, the above interval d, and widths a and b are preferably as small as possible.

However, it is impossible from the practical point of view to make the interval d, and widths a and b smaller than the above lower limits, while larger interval d, and widths a and b than the above upper limits provide a heat spreader cut from the stripe-pattern laminated metal body with uneven characteristics depending on cut positions. Further, in the production of the semiconductor device and during the heat hysteresis of the semiconductor device used, there is provided an uneven thermal stress at boundaries between the Fe—Ni alloy sheets 21 and the Cu-group metal sheets 22 due to the difference in a thermal expansion coefficient therebetween, making it likely that the heat spreader is broken at the boundaries between the Fe—Ni alloy sheets 21 and the Cu-group metal sheets 22 and that the bonding of the silicon chip 1 to the resin or ceramic package is uneven. Accordingly, it is preferable that the interval d of stripes, the width a of each Fe—Ni alloy sheet 21 and the width b of each Cu-group metal sheet are within the above upper and lower limits. The stripe interval d is more preferably 0.1–1 mm, most preferably 0.1–0.5 mm.

The first heat spreader 2 can be produced by integrally bonding the Fe—Ni alloy sheets 21 and the Cu-group metal sheets 22 stacked alternatingly by hot isostatic pressing, rolling the resultant integrated laminate and cutting it to a predetermined size as mentioned in detail below. In the resultant heat spreader, the Fe—Ni alloy and the Cu-group metal are well diffused to each other at their boundaries, thereby enhancing the reliability of the diffusion-bonded metal laminate of the Fe—Ni alloy sheets and the Cu-group sheets as a heat spreader for the semiconductor device.

Also, by sufficient bonding of the Fe—Ni alloy sheets and the Cu-group metal sheets by hot isostatic pressing, a high rolling reduction or draft can be achieved in the subsequent rolling of the multi-layer laminate of the Fe—Ni alloy sheets and the Cu-group metal sheets without suffering from peeling of these sheets at their boundaries. Thus, it is possible to obtain an integrated stripe-pattern laminated metal body 28 consisting of a plurality of Fe—Ni alloy sheets 21 and a plurality of Cu-group metal sheets 22 with a stripe interval d of 1 mm or less, preferably 0.5 mm or less. Such a small stripe interval d leads to the relaxation of local stress which is generated due to the difference in a thermal expansion coefficient between the Fe—Ni alloy and the Cu-group metal.

The rolling of the integrated stripe-pattern laminate slab to a strip can advantageously be controlled so that the integrated stripe-pattern laminate has a desired thickness as a heat spreader, and a heat spreader can be produced simply by cutting the rolled stripe-pattern laminate, which is advantageous from the viewpoint of mass-production.

Figure 7A:
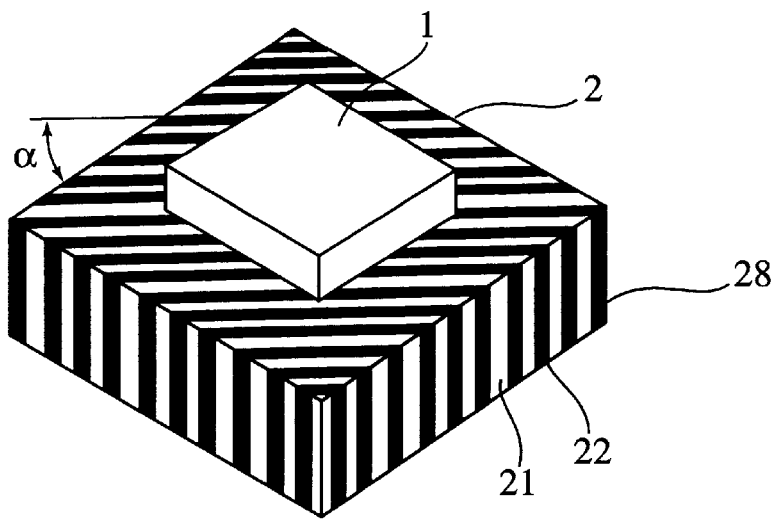
FIGS. 7(a) and (b) are perspective views each showing a heat spreader according to another embodiment of the present invention.

In the case of cutting the rolled stripe-pattern laminate to a heat spreader particularly by shear cutting, it is likely that excess burr is generated at a cut surface and that the Fe—Ni alloy sheets 21 and the Cu-group metal sheets 22 are peeled from each other, failing to provide a heat spreader with desired shape and size. Thus, according to the first embodiment of the present invention, the rolled stripe-pattern laminate is cut such that stripe patterns of the alternating sheets cross side edges of the resultant heat spreader 2, namely such that the stripe patterns appear on side surfaces of the heat spreader 2. If the stripe patterns of the alternating sheets cross all side edges of the resultant heat spreader 2 as shown in FIG. 7(a), it is most desirable to prevent the peeling of the Fe—Ni alloy sheets 21 from the Cu-group metal sheets 22. Such cutting of the rolled stripe-pattern laminate is referred to as "cross-pattern cutting" herein.

Figure 7B:
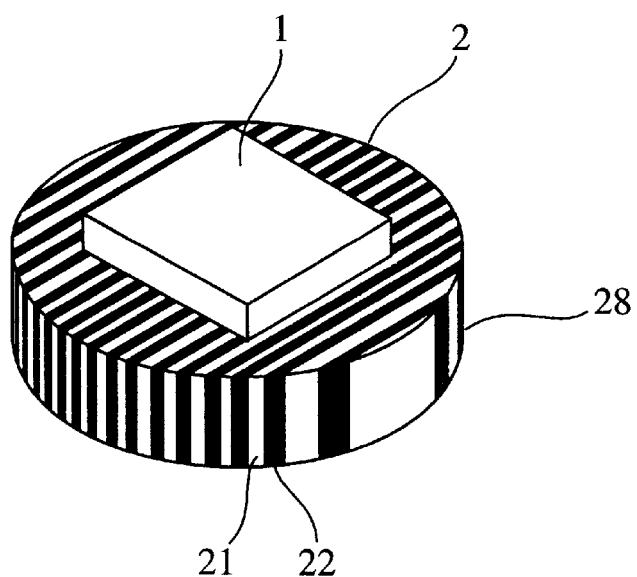

The cross-pattern cutting reduces the burring and peeling even when the rolled stripe-pattern laminate is shear-cut. In a case where all edges of the cut stripe-pattern laminate are straight, namely all side surfaces of the cut stripe-pattern laminate are flat as shown in FIG. 7(a), a cross angle α of the stripe pattern to the edge is preferably 45°±20°. When the cross angle α is less than 25°, excess burr is generated at shear-cut surfaces. On the other hand, when the cross angle α exceeds 65° at one edge, the cross angle α at an adjacent edge is less than 25°, leading to excess generating of burr and peeling. In the case of a circular heat spreader as shown in FIG. 7(b), there is a region in which the cross angle α is less than 25° or higher than 65°, but it should be noted that such region is extremely small, avoiding the generation of excess burr, and that the peeling if any would little affect the shape and size of the resultant heat spreader.

(B) Second Heat Spreader

Figure 8A:
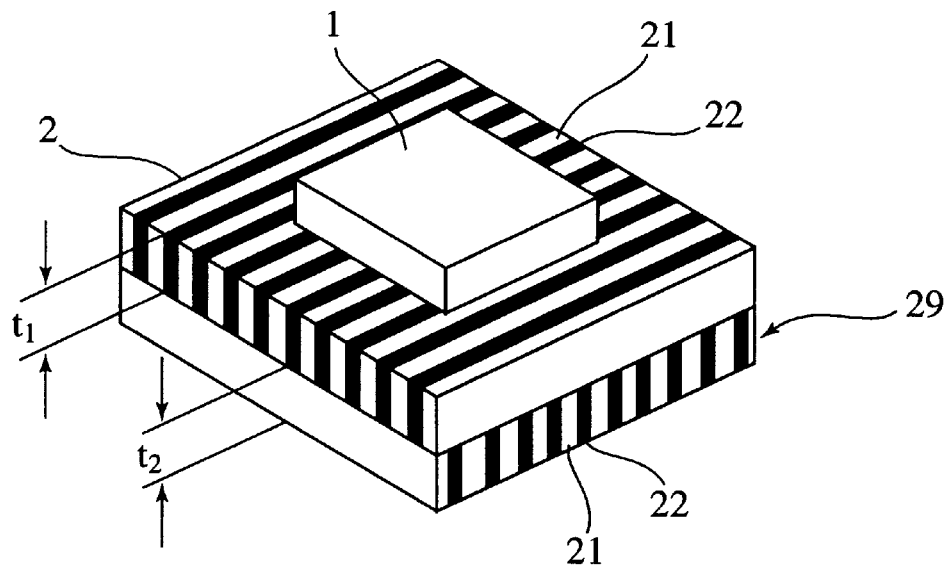
FIGS. 8(a) and (b) are perspective views each showing a heat spreader according to a still further embodiment of the present invention.

According to another embodiment of the present invention, two rolled stripe-pattern laminate 28 are stacked such that their stripe directions are perpendicular to each other as shown in FIG. 8(a), and bonded together to provide an integrated composite stripe-pattern laminate 29 which is preferably usable as a heat spreader 2. The stacking of a plurality of rolled stripe-pattern laminates in a perpendicularly crossing manner contributes to reducing the anisotropy of a thermal conductivity and a thermal expansion coefficient in a plane to which the silicon chip is mounted, thereby providing the semiconductor device with higher reliability. FIG. 8(a) shows an example of two-layer laminate, and more uniform thermal conductivity and thermal expansion coefficient are achieved by stacking three or more layers.

Figure 8B:
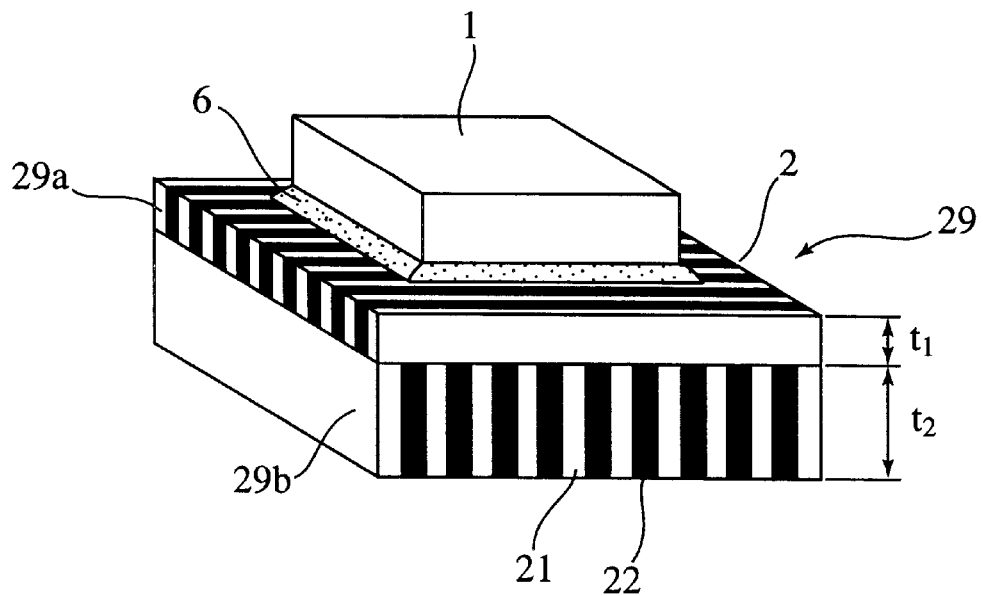

In the case of the two-layer laminate, it is possible to adjust the in-plane anisotropy of a thermal expansion coefficient by changing a ratio of a thickness $t_1$ of a layer 29a on the side of the chip 1 to a thickness $t_2$ of a layer 29b on the other side, as shown in FIG. 8(b). For instance, when the integrated stripe-pattern laminate 29a expands or shrinks laterally due to temperature change in the example of FIG. 8(b), the integrated stripe-pattern laminate 29b functions to prevent the expansion and shrinkage of the integrated stripe-pattern laminate 29a, as long as the ratio $t_1/t_2$ is within a suitable range.

The ratio $t_1/t_2$ is preferably within the range of $1/1.5$–$1/3$. When the ratio $t_1/t_2$ is too large, namely when the integrated stripe-pattern laminate 29b is too thin compared with the integrated stripe-pattern laminate 29a, the sufficient function of the integrated stripe-pattern laminate 29b cannot be obtained. Specifically, when the ratio $t_1/t_2$ is larger than $1/1.5$, the chip 1 strongly die-bonded to the integrated stripe-pattern laminate 29a by a bonding material layer 6 is likely to be cracked. On the other hand, when the ratio $t_1/t_2$ is too small, the expansion and shrinkage of the integrated stripe-pattern laminate 29b exerts large effects. Specifically, when the ratio $t_1/t_2$ is smaller than $1/3$, the chip 1 is likely to be cracked.

In a case where three or more integrated stripe-pattern laminates are stacked, an in-plane anisotropy of an thermal expansion coefficient can be controlled more precisely by changing the thickness of each integrated stripe-pattern laminate. The production of the composite laminate 29 can be achieved by brazing of the integrated stripe-pattern laminates 29a, 29b or by a composite rolling method mentioned below.

(C) Third Heat Spreader

Figure 1:
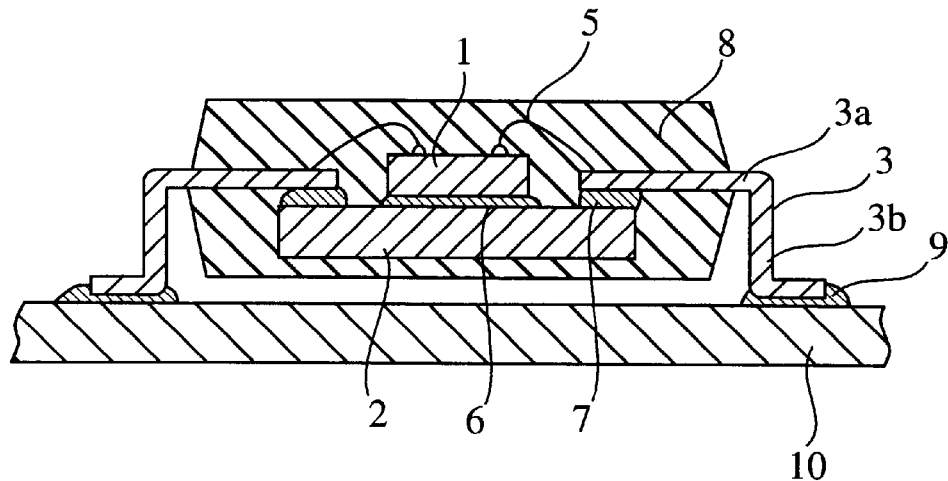
FIG. 1 is a vertical cross-sectional view showing an example of conventional semiconductor devices.
Figure 2:
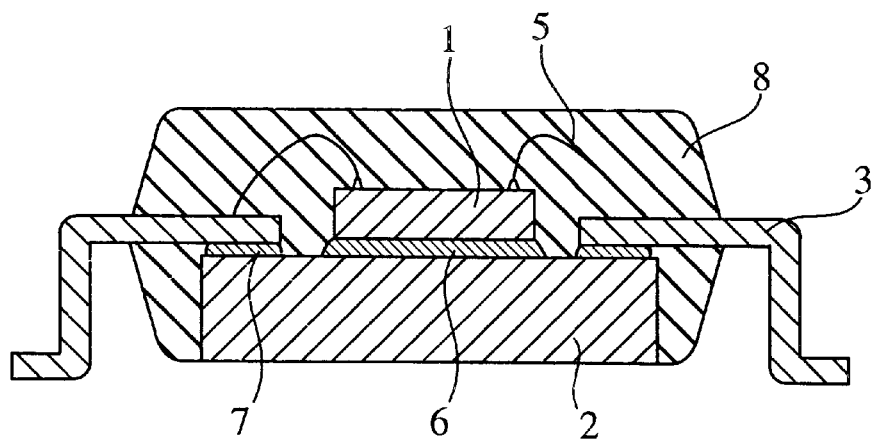
FIG. 2 is a vertical cross-sectional view showing another example of conventional semiconductor devices.
Figure 3:
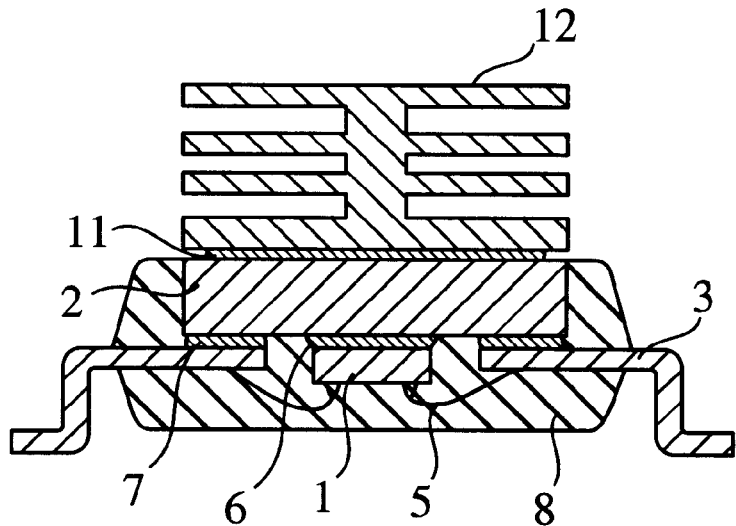
FIG. 3 is a vertical cross-sectional view showing a further example of conventional semiconductor devices.
Figure 4:
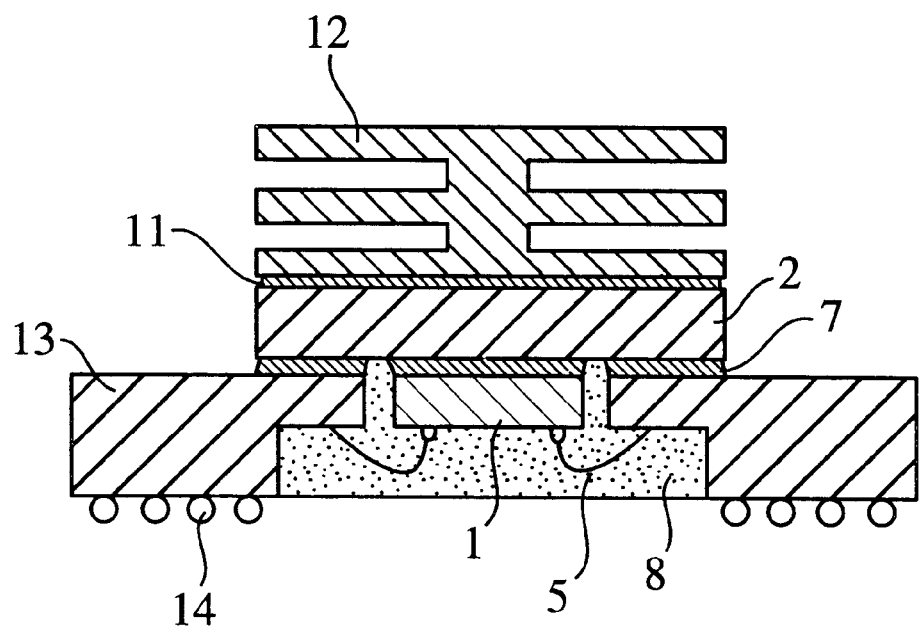
FIG. 4 is a vertical cross-sectional view showing a still further example of conventional semiconductor devices.
Figure 5:
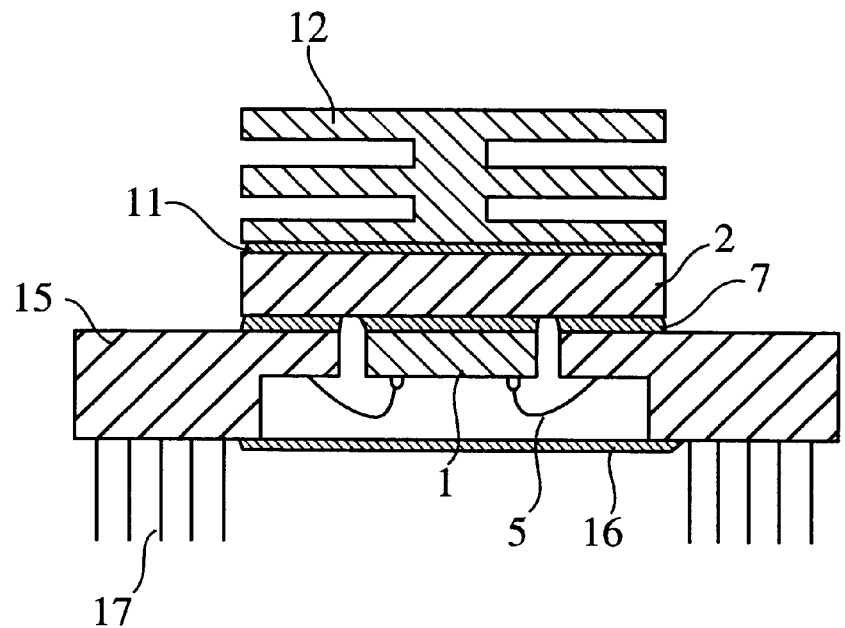
FIG. 5 is a vertical cross-sectional view showing a still further example of conventional semiconductor devices.
Figure 9:
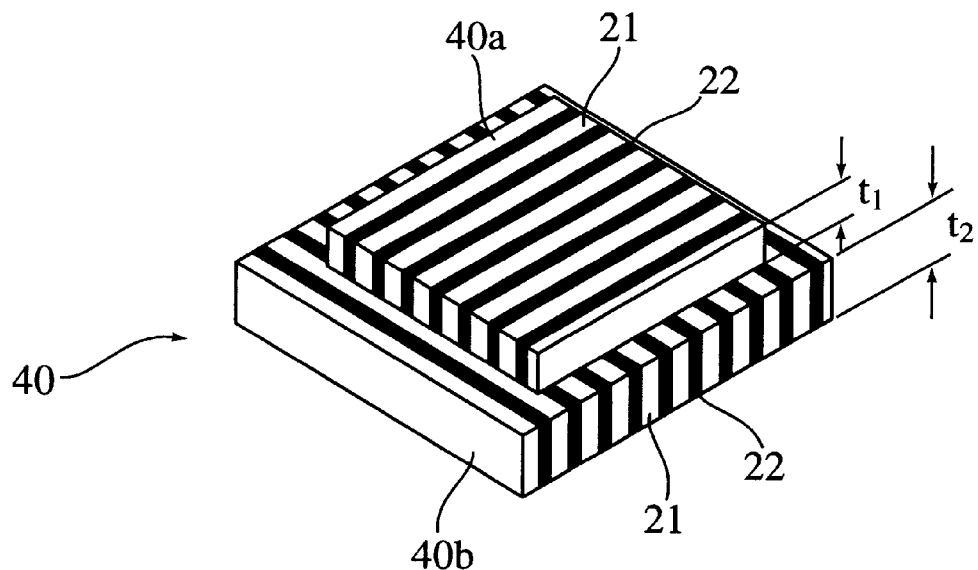
FIG. 9 is a perspective view showing a heat spreader according to a still further embodiment of the present invention.

By stacking two integrated stripe-pattern laminates 40a, 40b of different sizes such that the resultant composite laminate 40 has steps as shown in FIG. 9, a stepped heat spreader can be produced. Such a stepped heat spreader may be used as a heat spreader 2, for instance, for a cavity-down type semiconductor device as shown in FIGS. 4 and 5. Also, in a heat spreader 2 whose bottom surface is exposed from a resin 8 as shown in FIG. 2, the resin 8 is well bonded to the heat spreader 2 if the heat spreader 2 has stepped side surfaces. While conventional stepped heat spreaders are produced by machining integral metal bodies, those of the present invention can easily be produced by bonding two or more integrated stripe-pattern laminates of different sizes by brazing, etc. Two or more steps can be provided by laminating three or more integrated stripe-pattern laminates of different sizes.

Figure 15:
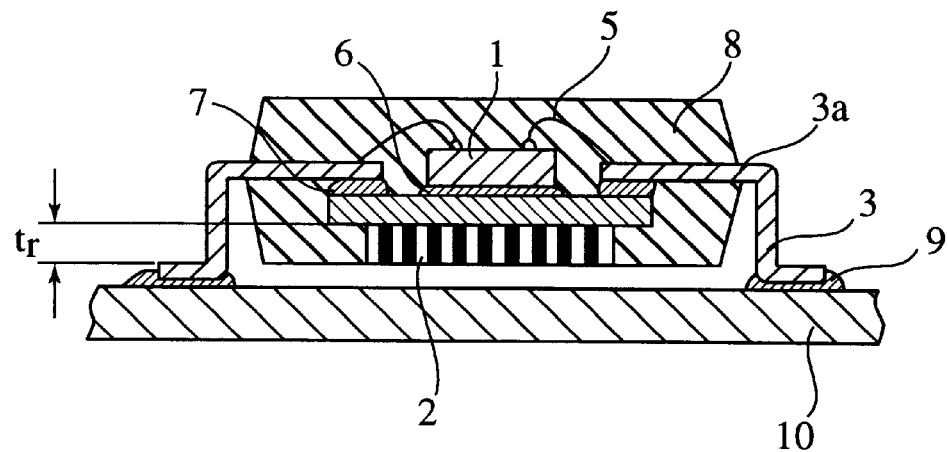
FIG. 15 is a cross-sectional view showing a semiconductor device according to one embodiment of the present invention.
Figure 16A:
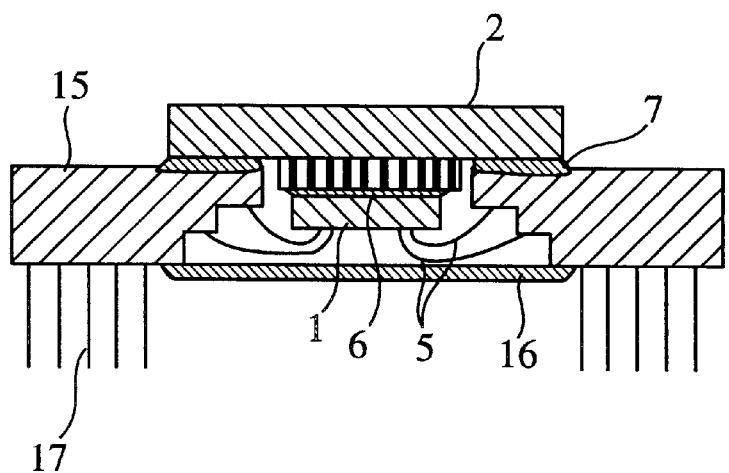
FIG. 16(a) is a vertical cross-sectional view showing a semiconductor device according to another embodiment of the present invention.
Figure 17A:
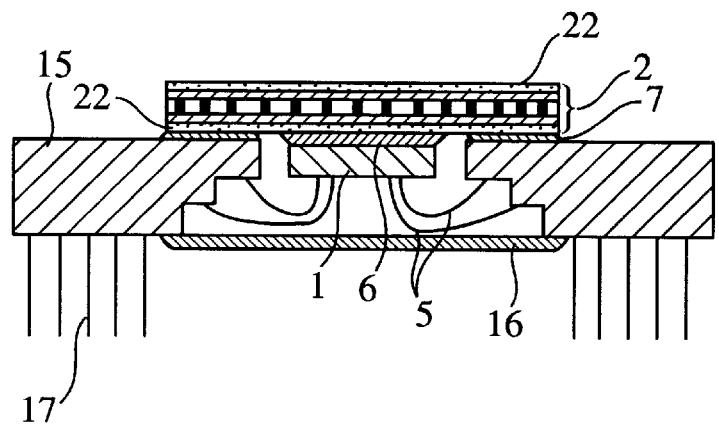
FIG. 17(a) is a vertical cross-sectional view showing a semiconductor device according to a further embodiment of the present invention.

In the stepped composite laminate 40 formed of two integrated stripe-pattern laminates of different sizes as shown in FIG. 9, the ratio $t_1/t_2$ is preferably within the range of $1/1.5$–$1/3$. The stepped heat spreader may be assembled in a semiconductor device such that the bottom surface of the stepped heat spreader is exposed from a resin 8 as shown in FIG. 15. In this example, the thickness $t_2$ of the lower integrated composite laminate 40b corresponds to the thickness of the resin 8 supporting the heat spreader 2 (referred herein to as "effective resin thickness $t_r$"). Since a usual heat spreader is as thick as 1.5–2 mm, a sufficient effective resin thickness $t_r$ can be provided as long as the ratio $t_1/t_2$ is within the above range. In the case of a ceramic package as shown in FIGS. 16(a) and 17(a), as long as the ratio $t_1/t_2$ is within the above range, a surface of the chip 1 is kept away from a cap 16 by a proper distance, avoiding the bonding wires 5 from coming into contact with the cap 16, and there is provided a small difference in height between the chip 1 and the bonding positions of the wires on the ceramic substrate 15, avoiding any troubles at the time of wire bonding.

(D) Fourth Heat Spreader

Figure 10A:
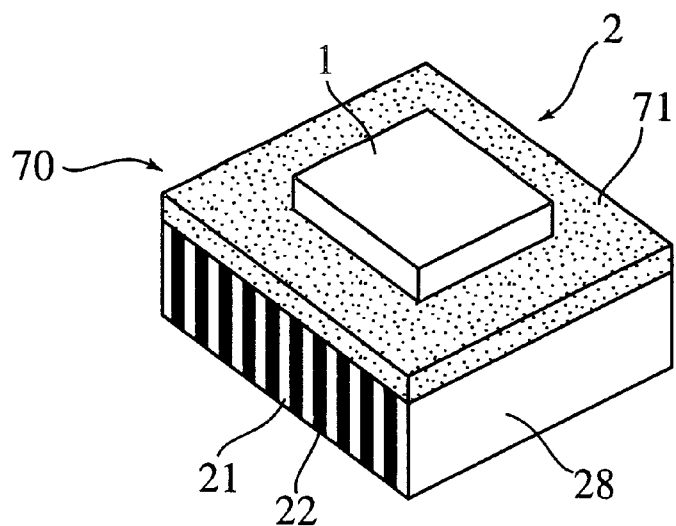
FIGS. 10(a) and (b) are perspective views each showing a heat spreader according to a still further embodiment of the present invention.
Figure 10B:
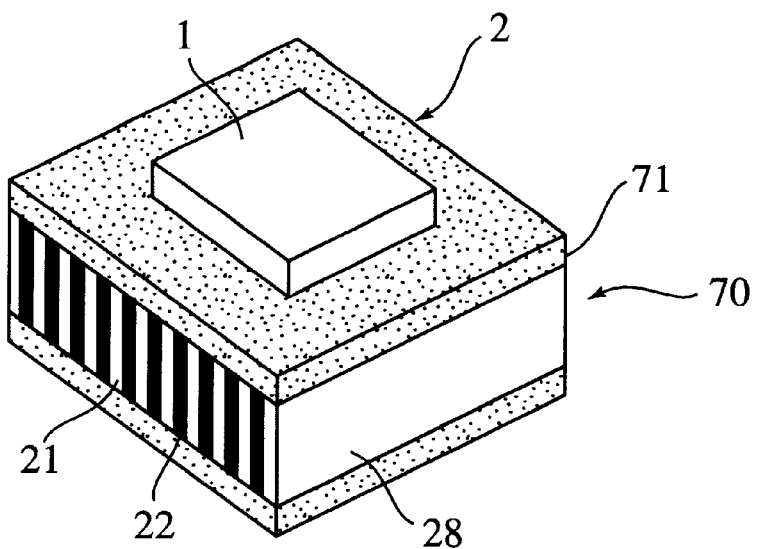

According to a further embodiment of the present invention, the integrated stripe-pattern laminate is covered by a Cu-group metal layer 71 on a chip-mounting surface as shown in FIG. 10. With this overlying Cu-group metal layer 71, uniform heat conduction can be achieved even when the stripe interval d is relatively large. The overlying Cu-group metal layer 71 is placed only on a chip-mounting surface in the embodiment of FIG. 10(a), while both of upper and lower surfaces of the heat spreader may be covered by Cu-group metal layers 71, 71 as shown in FIG. 10(b). The covering of the integrated stripe-pattern laminate 28 with a thin Cu-group metal layer 71 can be carried out by brazing, plating or by a method mentioned below. The thin Cu-group metal layer 71 may also be applied to the integrated stripe-pattern laminate 29, 40 shown in FIGS. 8 and 9.

(E) Fifth Heat Spreader

Figure 11:
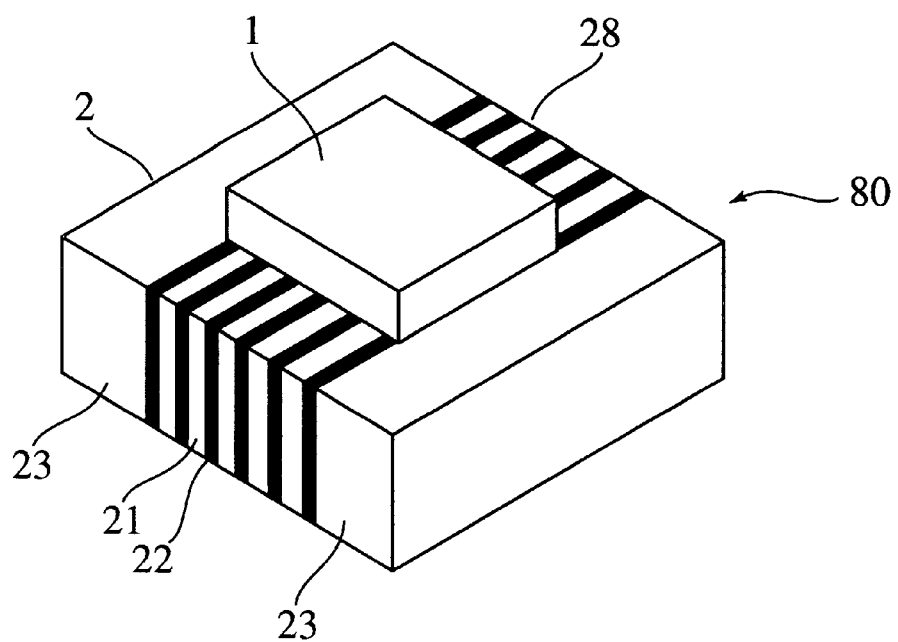
FIG. 11 is a perspective view showing a heat spreader according to a still further embodiment of the present invention.

According to a still further embodiment of the present invention as shown in FIG. 11, both sides of the integrated stripe-pattern laminate 28 are covered by Ti layers 23, 23. Since Ti has excellent adhesion to the resin, it is suitable particularly for the plastic package shown in FIGS. 1–4. Though titanium layers 23, 23 need only be bonded to at least corners of the integrated stripe-pattern laminate 28, the bonding of Ti layers 23, 23 to both sides of the integrated stripe-pattern laminate 28 as shown in FIG. 11 is advantageous in that the resultant composite heat spreader 80 can be cut from a long laminate body of the stripe-pattern laminate 28 and the Ti layers 23, 23. The Ti layers 23 preferably has a thickness of 0.1–10 mm. The Ti layers 23, 23 may be bonded to the integrated composite laminate 29, 40 shown in FIGS. 8 and 9 or to the composite laminate 70 comprising the integrated stripe-pattern laminate 28 covered by the Cu-group metal layer 71 as shown in FIG. 10.

(F) Sixth Heat Spreader

FIGS. 12 and 13 show examples of heat spreaders according to the second invention. Both of FIGS. 12 and 13 are horizontal cross-sectional views, in which constituent metal sheets are laminated in thickness direction.

Figure 12A:
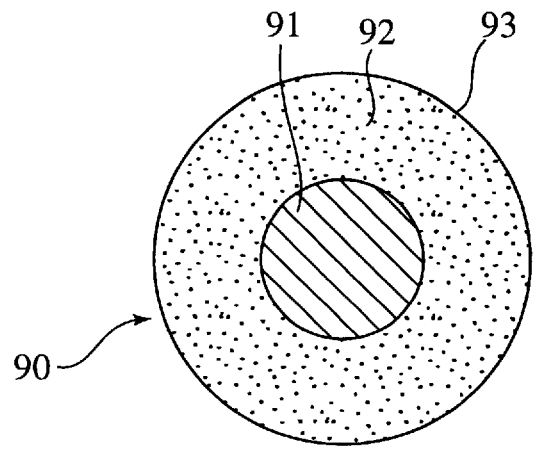
FIGS. 12(a)–(f) are horizontal cross-sectional views each showing a heat spreader according to a still further embodiment of the present invention.

In FIG. 12(a), the heat spreader 90 is constituted by a center portion 91 made of an Fe—Ni alloy to which a chip is mounted, an outer portion 92 made of a Cu-group metal and a peripheral portion 93 made of titanium.

Figure 12B:
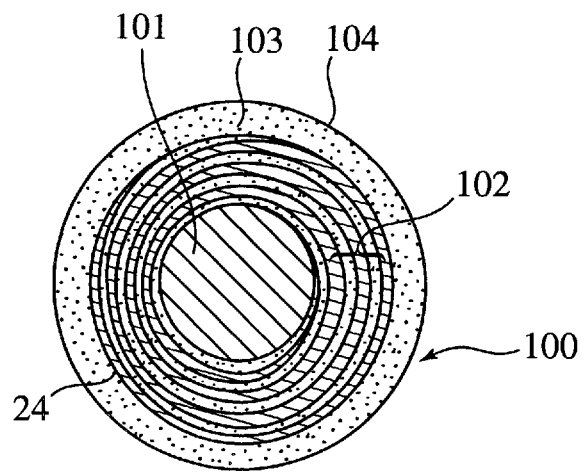

In FIG. 12(b), the heat spreader 100 is constituted by a center portion 101 made of an Fe—Ni alloy, a first intermediate portion 102 constituted by a spirally wound laminate 24 consisting of an Fe—Ni alloy sheet 21 and a Cu-group metal sheet 22, a second intermediate portion 103 made of a Cu-group metal, and a peripheral portion 104 made of titanium.

Figure 12C:
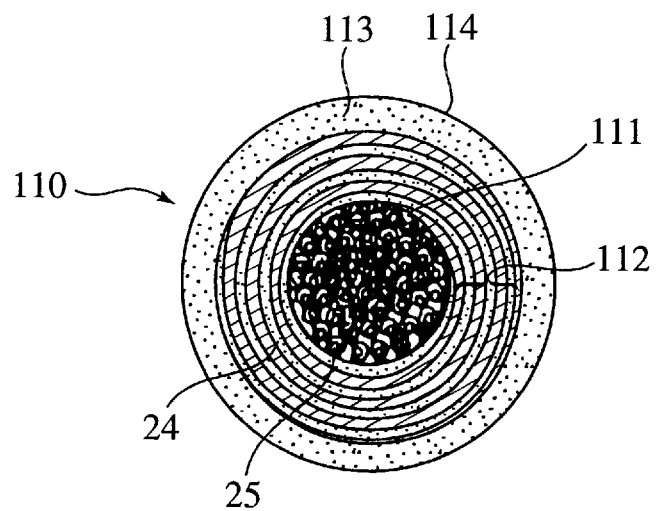

FIG. 12(c) shows a heat spreader 110 consisting of a center portion 111 constituted by an assembly of Fe—Ni alloy wires 25 coated with a Cu-group metal, a first intermediate portion 112 constituted by a spirally wound laminate 24 consisting of an Fe—Ni alloy sheet 21 and a Cu-group metal sheet 22, a second intermediate portion 113 constituted by a Cu-group metal, and a peripheral portion 114 made of titanium.

Figure 12D:
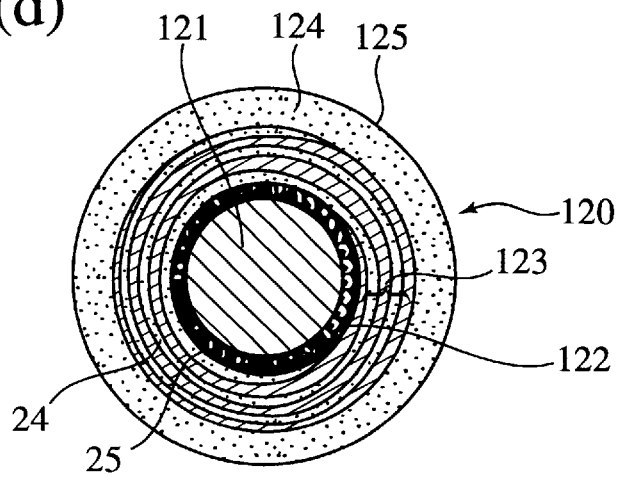

The heat spreader 120 shown in FIG. 12(d) comprises a center portion made of Fe—Ni alloy 121, a first intermediate portion 122 constituted by a similar coated wire assembly 25, a second intermediate portion 123 constituted by a spirally wound laminate 24, a third intermediate portion 124 made of a Cu-group metal, and a peripheral portion 125 made of titanium.

Figure 12E:
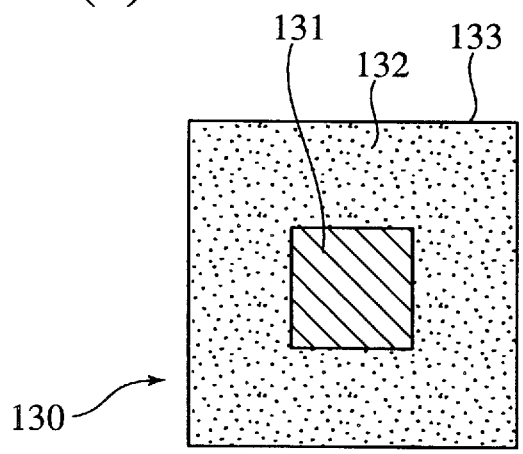
Figure 12F:
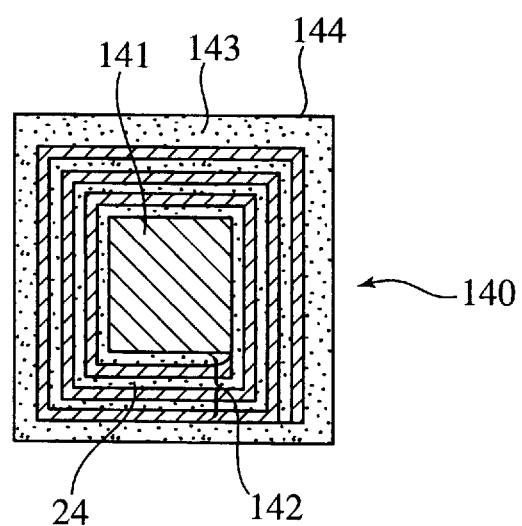

FIGS. 12(e) and (f) show rectangular counterparts of the heat spreaders 90, 100 of FIGS. 12(a) and (b), which may be rectangular counterparts of those of FIGS. 12(c) and (d). The heat spreader 130 is constituted by a center portion 131 made of an Fe—Ni alloy, an outer portion 132 made of a Cu-group metal and a peripheral portion 133 made of titanium. Also, the heat spreader 140 is constituted by a center portion 141 made of an Fe—Ni alloy, a first intermediate portion 142 constituted by a spirally wound laminate 24, a second intermediate portion 143 made of a Cu-group metal, and a peripheral portion 144 made of titanium. The laminate 24 may be composed of concentrically alternating Fe—Ni alloy sheets 21 and Cu-group metal sheets 22 having a circular or rectangular cross section instead of the spirally wound shape.

(G) Seventh Heat Spreader

Figure 13A:
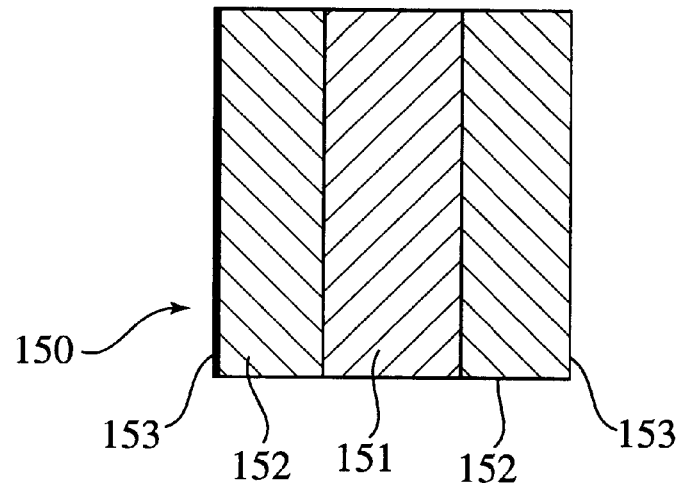
FIGS. 13(a) and (b) are horizontal cross-sectional views each showing a heat spreader according to a still further embodiment of the present invention.
Figure 13B:
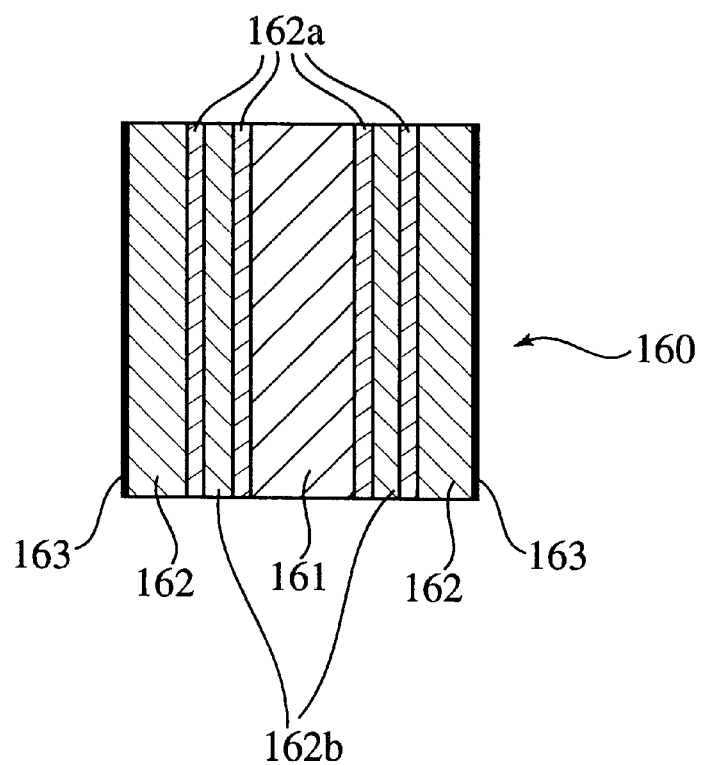

FIG. 13(a) is a horizontal cross-sectional view taken from above, which shows a heat spreader 150 composed of a center portion 151 made of a Fe—Ni alloy, two outer portions 152, 152 each made of a Cu-group metal and two peripheral portions 153, 153 each made of titanium. FIG. 13(b) is a horizontal cross-sectional view taken from above, which shows a heat spreader 160 composed of a center portion 161 made of a first Fe—Ni alloy, two outer portions 162, 162 each constituted by an alternate laminate consisting of second Fe—Ni alloy sheets 162a having a different composition from that of the first Fe—Ni alloy and Cu-group metal sheets 162b, and two peripheral portions 163, 163 each made of titanium. In the preferred embodiment, the first Fe—Ni alloy may be a 42%-Ni alloy, and the second Fe—Ni alloy may be a 36%-Ni alloy.

(H) Application of Heat Spreader

The heat spreaders of the present invention, particularly those according to the embodiments as shown in FIGS. 12 and 13 are effective particularly when die-bonding is carried out with eutectic alloys such as Pb/Sn, Au/Si, Au/Sn, etc. Though these eutectic alloys are vulnerable to failure by heat strain, the heat spreader having a center portion made mainly of an Fe—Ni alloy having a low thermal expansion coefficient with which a chip is in contact and an outer portion made mainly of a Cu-group metal having a high thermal conductivity according to the embodiments as shown in FIGS. 12 and 13 provides semiconductor devices with excellent thermal strain resistance and thermal conductivity. Particularly the heat spreader having an intermediate portion constituted by a spirally wound laminate 24 of two metal sheets is preferable in that the thermal conductivity and thermal expansion coefficient can be changed gradually from a center to a periphery. Incidentally, when another member is used to bond the heat spreader to the resin package, or when the heat spreader is contained in a BGA-type plastic or ceramic package, the peripheral portion made of titanium is not necessary.

Figure 14A:
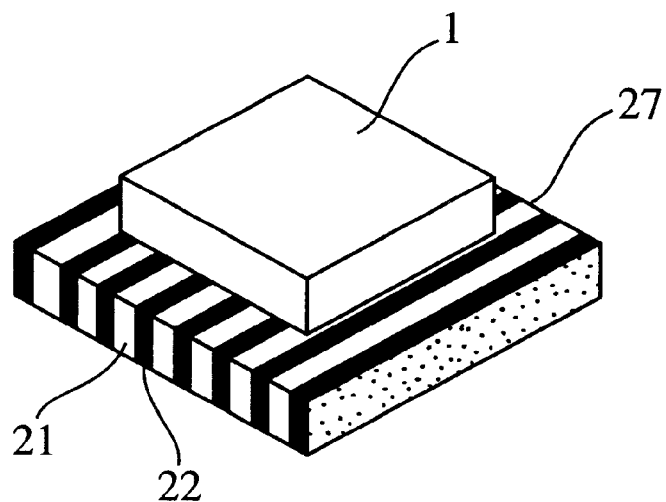
FIGS. 14(a) and (b) are perspective views each showing a heat spreader according to a still further embodiment of the present invention.
Figure 14B:
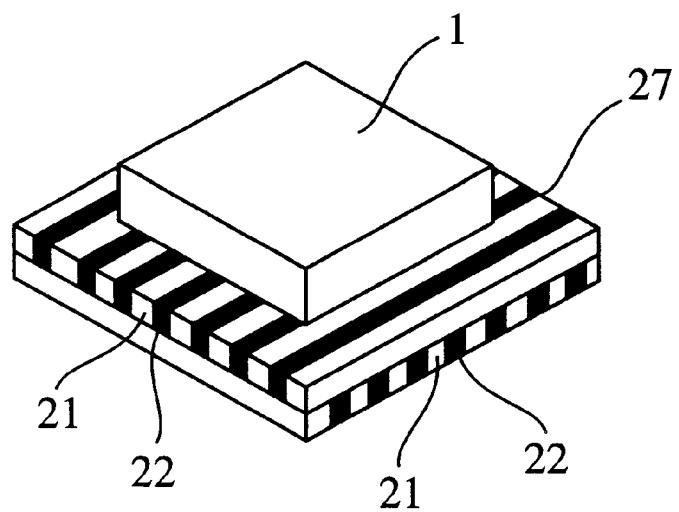
FIGS. 14(c) and (d) are vertical cross-sectional views each showing a heat spreader according to a still further embodiment of the present invention.
Figure 14C:
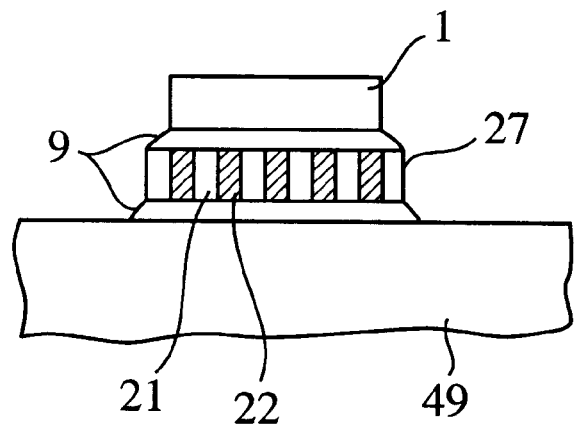
Figure 14D:
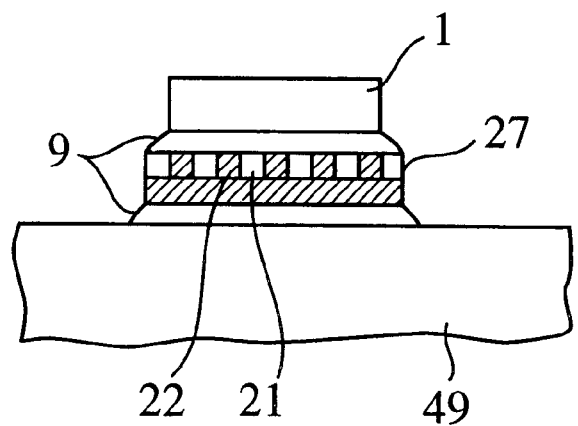

The heat spreader as described above can function as a stress buffer usable for power transistors and power modules, and such stress buffer is within the scope of the present invention. FIG. 14 shows a stress buffer 27 inserted between the chip 1 and a header 49 and soldered thereto. FIGS. 14(a) and (b) are partial perspective views, and FIGS. 14(c) and (d) are partial cross-sectional views corresponding to those of FIGS. 14(a) and (b). The heat spreader shown in FIG. 14 is also excellent in heat dissipation, free from such problems as solder fatigue due to thermal strain, stress failure due to Ag brazing, etc. As far as a structure is concerned, the heat spreader of FIG. 14 may have various structures shown in FIGS. 6–13 or combinations thereof. Though conventional heat spreaders using Mo are poor in machinability and platability, such problems have been solved by the heat spreader of the present invention.

[2] Semiconductor Device

Figure 16B:
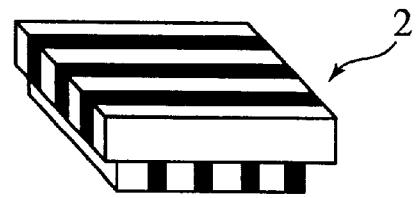
FIG. 16(b) is a perspective view showing a stepped composite heat spreader contained in the semiconductor device of FIG. 16(a)
Figure 17B:
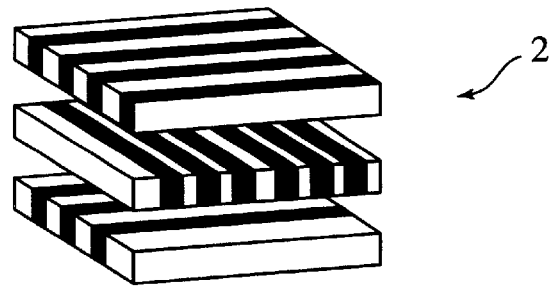
FIG. 17(b) is an exploded perspective view showing a composite heat spreader contained in the semiconductor device of FIG. 17(a)

The semiconductor device of the present invention comprises the heat spreader 2 as shown in FIGS. 6–13, or it may comprise such a heat spreader 2 as a stress buffer 27 shown in FIG. 14. Various types of semiconductor devices are exemplified in FIGS. 1–5. Semiconductor devices comprising the stepped heat spreader of FIG. 9 are shown in FIGS. 15–17. The semiconductor device shown in FIG. 15 comprises a stepped heat spreader 2 whose bottom surface is exposed from a resin 8, the stepped heat spreader 2 being well bonded to the resin 8 by an effective resin thickness $t_r$. FIGS. 16(a) and 17(a) show examples of cavity-down type semiconductor devices each comprising a pin grid array (PGA) of a ceramic package. The arrangements of the stripe patterns of the integrated stripe-pattern laminates constituting the stepped heat spreaders are shown in FIGS. 16(b) and 17(b). These semiconductor devices may exhibit the same effects as those comprising the heat spreaders shown in FIGS. 6–13.

Figure 19:
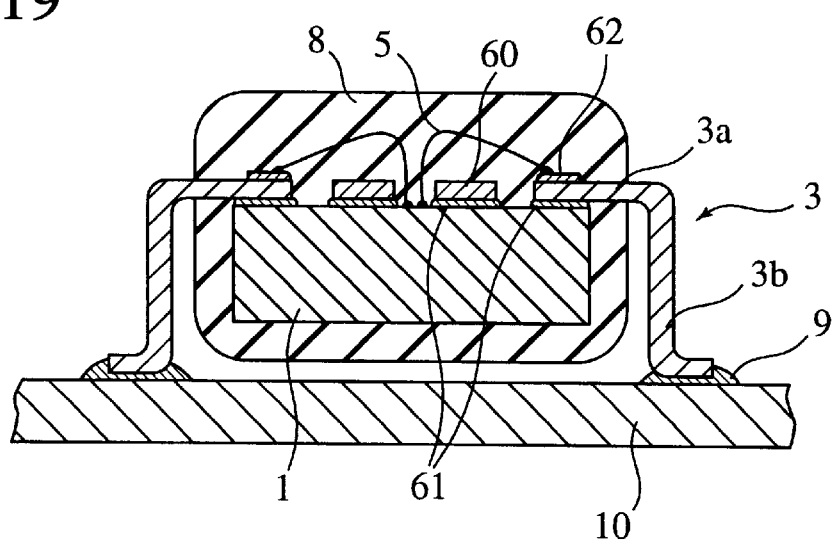
FIG. 19 is a vertical cross-sectional view showing the plastic package of FIG. 18.
Figure 18:
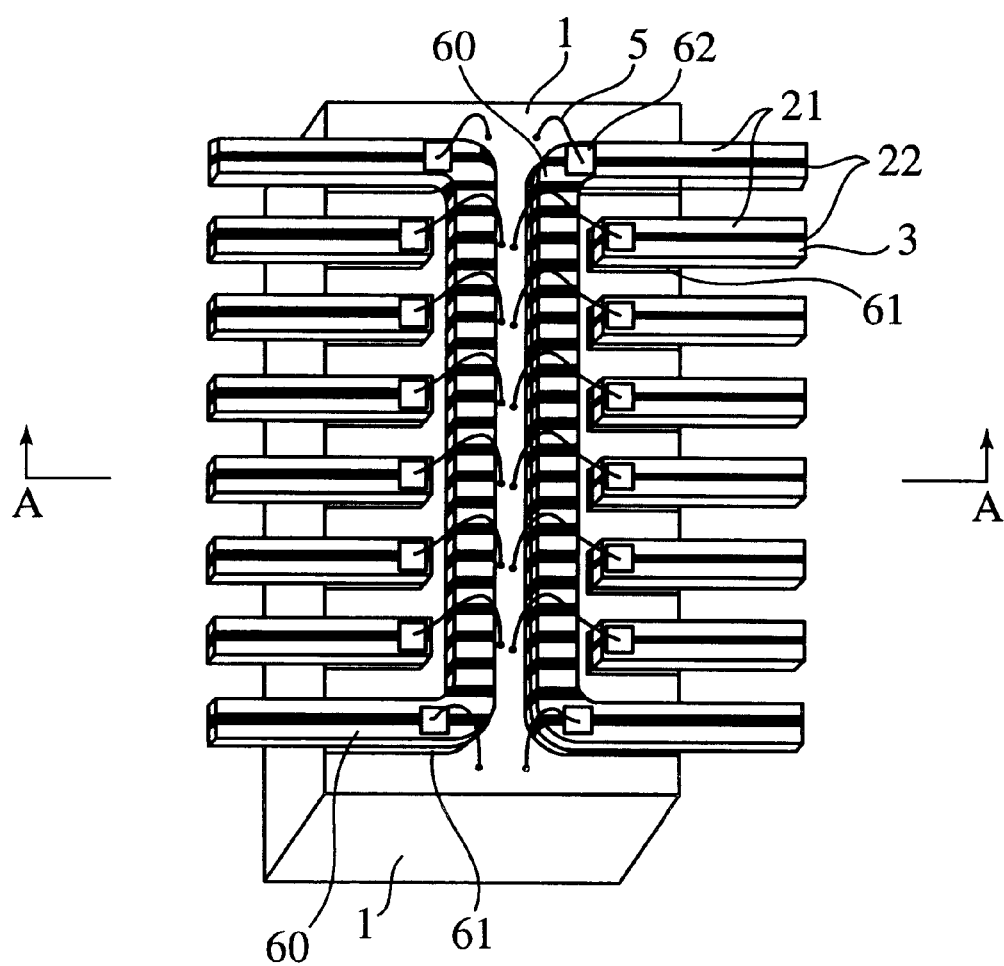
FIG. 18 is a perspective view showing a lead frame as a heat spreader for a LOC type package according to one embodiment of the present invention.

The heat spreader of the present invention may function as a lead frame. FIGS. 18 and 19 show an example of a plastic package having an LOC structure. In FIG. 18, an integrated stripe-pattern laminate 28 is etched or punched out to a lead frame pattern, and connected to a chip 1. Inner lead portions 3a of the lead frame 3 and bas bars 60 are connected to the chip 1 through an insulating film 61, and a circuit (not shown) of the chip 1 is connected to Ag plating layers 62 partially provided on the inner lead portions 3a and the bas bars 60. FIG. 19 corresponding to the A—A cross-sectional view shows a semiconductor device in which outer lead portions 3b of the lead frame 3 are connected to a circuit on a substrate board 10 by soldering.

With a structure shown in FIGS. 18 and 19, the inner lead portions 3a and the bas bars 60 can be provided with increased thermal conductivity while keeping their thermal expansion coefficient low, thereby making it possible to use the lead frame as a heat spreader for dissipating a heat from the chip 1.

[3] Method for Producing Heat Spreader (A) First Method

FIG. 20 shows a method for producing a heat spreader according to an embodiment of the present invention. First, a plurality of Fe—Ni alloy sheets 21 and a plurality of Cu-group metal sheets 22 are stacked alternatingly and inserted into a capsule 41 as shown in FIG. 20(a). After closing the opening of the capsule 41 with a cap, the capsule 41 is evacuated by a vacuum pump 42 and sealed as shown in FIG. 20(b). The sealed capsule 41 is placed in a hot isostatic press apparatus 43 and subjected to hot isostatic pressing (HIP) to produce a slab 30 as shown in FIG. 20(c). The HIP conditions are preferably a temperature of a melting point of a Cu-group metal or lower, for instance 900° C., and a pressure of about 1200 atms. Next, as shown in FIG. 20(d), the slab 30 is rolled by passing through a pair of rolls 44 disposed in perpendicular to the stripe direction of the slab 30 to form a rolled stripe-pattern laminate 38. In this case, the slab 30 may optionally be cut to a proper size before rolling. the rolled stripe-pattern laminate 38 is cut to a proper size to form a stripe-pattern laminated metal body 28 as shown in FIG. 20(f).

In the preferred embodiment of the present invention, two or more rolled stripe-pattern laminates 38 are stacked such that their stripe directions are perpendicular to each other as shown in FIG. 20(e), and bonded together by hot pressing to provide a composite slab 29, which is then cut to a desired shape to provide a composite heat spreader. The number of the integrated stripe-pattern laminates 38 stacked is not limited to two, and three or more integrated stripe-pattern laminates may be stacked. The hot pressing conditions are such that two or more integrated stripe-pattern laminates 38 are bonded together and that Cu-group metal sheets 22 are fully bonded together. Specifically, they may be a temperature of 800–900° C., a pressure of 20–50 kgf/cm$^2$, and a time period of 0.1–1 hour. The brazing may be carried out with silver solder, etc.

(B) Second Method

FIG. 21 shows a second method for producing a heat spreader according to another embodiment of the present invention. A plurality of Fe—Ni alloy sheets 21 and a plurality of Cu-group metal sheets 22 are stacked alternatingly and inserted into a capsule 41 constituted by an outer wall 51 made of steel and an inner wall 52 made of Cu as shown in FIG. 21(a). In this embodiment, the capsule 41 is constituted by an outer wall 51 formed by a rectangular steel sheet which is lined with a Cu sheet for an inner wall 52, and lids 35 to be welded to the outer wall 51 after filling the laminate of Fe—Ni alloy sheets 21 and Cu-group metal sheets 22. Each lid 35 is constituted by an outer wall 51 made of steel and an inner wall 52 made of Cu. 37 indicates welding lines. The welded capsule 41 shown in FIG. 20(b) is subjected to hot isostatic pressing (HIP) to integrally bonding sheets in the capsule 41. The outer steel wall 51 is machined or ground to provide a slab 30 as shown in FIG. 21(c).

Figure 21A:
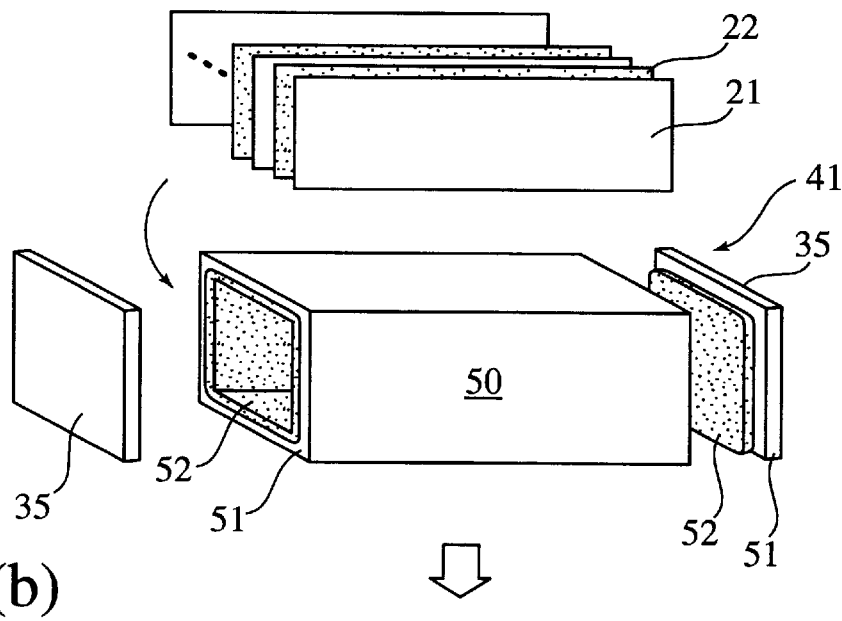
FIGS. 21(a)–(d) are schematic views showing the production process of a heat spreader according to another embodiment of the present invention.
Figure 21B:
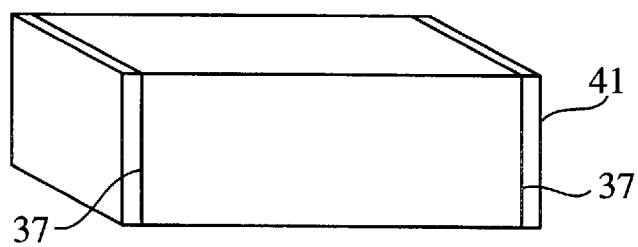
Figure 21C:
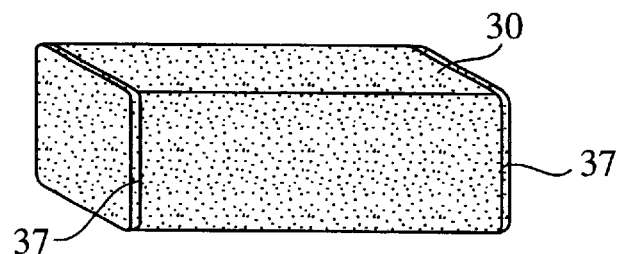
Figure 21D:
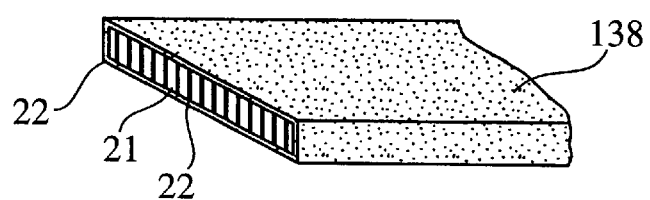
Figure 22A:
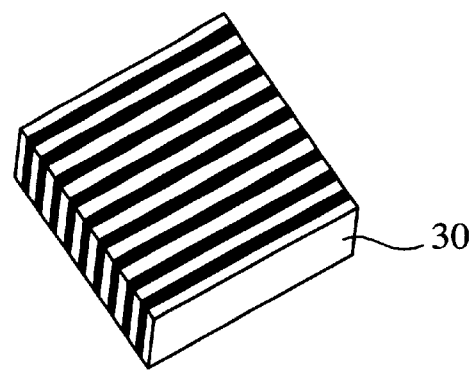
FIGS. 22(a)–(c) are schematic views showing the production process of a beat spreader according to a further embodiment of the present invention.
Figure 22A:
Figure 22B:
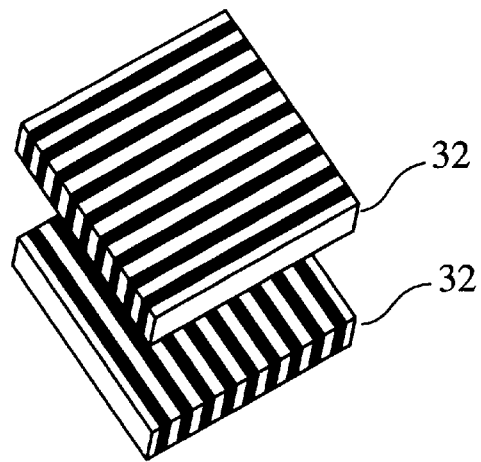
Figure 22B:
Figure 22C:
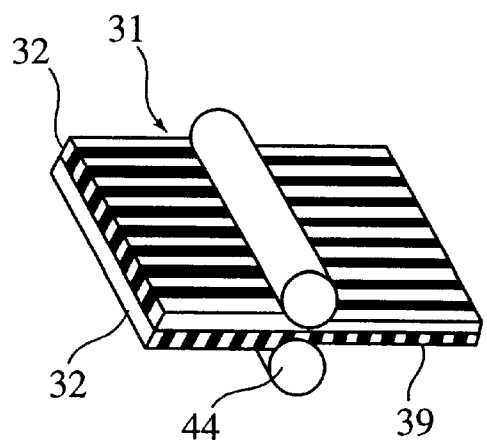
Figure 23A:
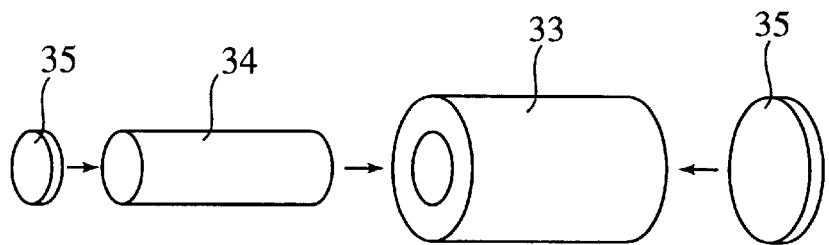
FIGS. 23(a)–(d) are schematic views showing the production process of a heat spreader according to a still further embodiment of the present invention.
Figure 23B:
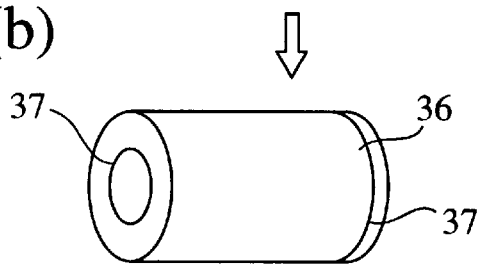
Figure 23C:
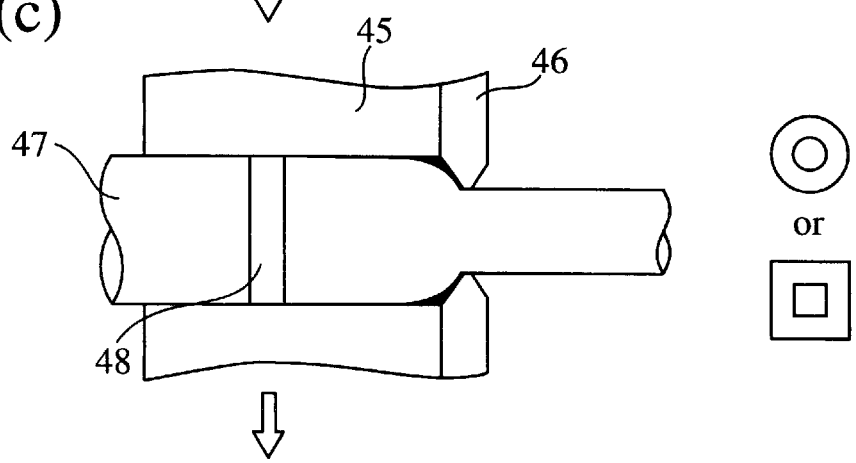
Figure 23D:
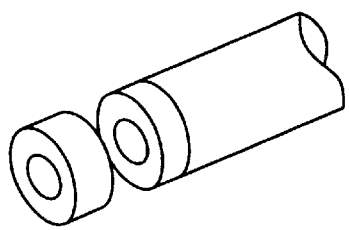
Figure 23D:
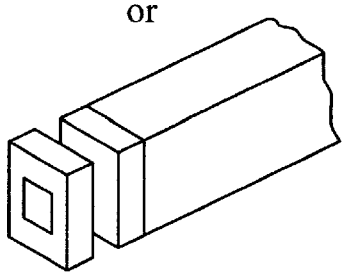
Figure 24A:
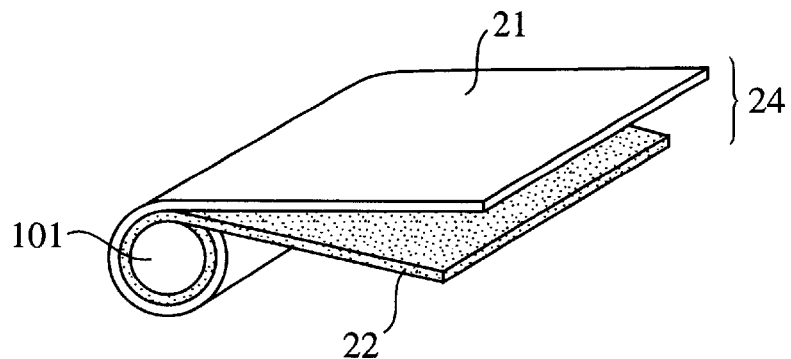
FIGS. 24(a)–(c) are schematic views showing the production process of a heat spreader according to a still further embodiment of the present invention.
Figure 24A:
Figure 24B:
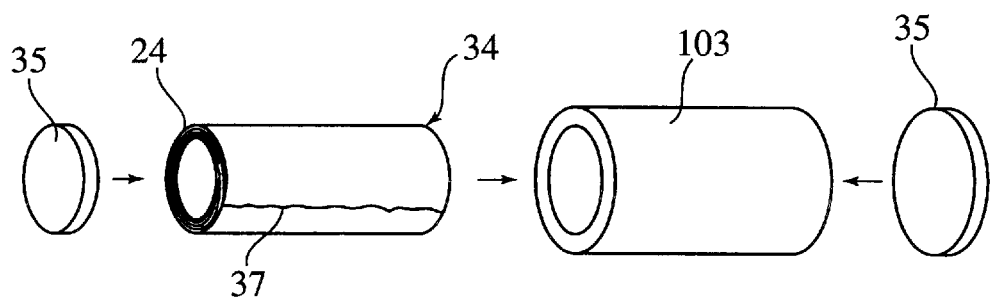
Figure 24B:
Figure 24C:
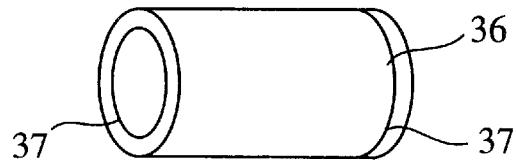

As shown in FIG. 21(d), the slab 30 is rolled to form a rolled composite stripe-pattern laminate 138. The rolled composite stripe-pattern laminate 138 comprising alternatingly laminated and integrally bonded Fe—Ni alloy sheets 21 and Cu-group metal sheets 22 has stripe patterns in a thickness direction and a rolling direction, and is covered by a Cu-group metal sheet on all sides. It is cut to a proper size to form a composite heat spreader covered by Cu-group metal sheets on all side surfaces as shown in FIG. 21(d).

Coated integrated stripe-pattern laminates 138 shown in FIG. 21(d) may similarly be stacked and bonded together by hot pressing or brazing to provide an integrated composite laminate.

In this embodiment, a plurality of Fe—Ni alloy sheets 21 and a plurality of Cu-group metal sheets 22 may be alternatingly laminated and wound with a Cu sheet on sides, followed by insertion into a capsule 41. The laminated sheets may be inserted into a capsule 41 having an outer steel wall 51 and an inner Cu wall 52 and subjected to HIP.

The HIP conditions may be the same as above, for instance, a temperature of 900° C. and a pressure of about 1200 atms. Since the capsule 41 is covered by the outer steel wall 51, the inner Cu wall 52 is protected from oxidation during HIP. Also, because the slab 30 from which the outer steel wall 51 is removed is rolled, the Cu wall of the resultant rolled stripe-pattern laminate is not contaminated by Fe.

(C) Third Method

FIG. 22 shows a third method for producing a heat spreader according to a further embodiment of the present invention. An integrated stripe-pattern laminate produced in a manner shown in FIG. 20 or 21 is HIPed to a slab 30 shown in FIG. 22(a) and cut perpendicularly to the stripe direction thereof. Two slabs 32 are stacked in such a manner that their stripe directions are perpendicular to each other as shown in FIG. 22(b), and bonded together by HIP to provide a composite slab 31. The HIP conditions may be the same as above, for instance, a temperature of 900° C. and a pressure of about 1200 atms. The number of the integrated stripe-pattern laminates 32 stacked is not limited to two, and three or more integrated stripe-pattern laminates may be stacked. The composite slab 31 is rolled in such a manner that at least one of the sheets 32 constituting the composite slab 31 has a stripe direction perpendicular to the axises of rolls 44. The rolled composite laminate 39 is cut to a desired shape to provide a composite heat spreader.

In the method of the present invention, by properly selecting the thicknesses and numbers of the Fe—Ni alloy sheets 21 and the Cu-group metal sheets 22, it is possible to produce a heat spreader with the ratio of these sheets, the stripe interval d, the width a of the Fe—Ni alloy sheet 21 and the width b of the Cu-group metal sheet 22 controlled to desired levels, stably at a high precision on a commercial production scale. The control by the number of sheets can be conducted, for instance, by alternatingly stacking one 0.15-mm-thick Fe—Ni alloy sheet and two 0.1-mm-thick Cu sheets.

FIG. 23 shows a method for producing a heat spreader shown in FIG. 12(a). As shown in FIG. 23(a), a solid cylindrical column 34 of an Fe—Ni alloy is inserted into a hollow Cu-group metal cylinder 33, and lids 35, 35 are welded thereto as shown in FIG. 23(b). The welded body is inserted into a container 45 as shown in FIG. 23(c), and pressed by a stem 47 via a dummy block 48 to carry out hot extrusion through a die 46 to a circular or rectangular cross section. The extrudate is then cut transversely by a diamond saw, etc. as shown in FIG. 23(d) to produce a heat spreader having a shape shown in FIG. 12(a).

FIG. 24 shows a method for producing a heat spreader shown in FIG. 12(b). The spiral laminate 24 shown in FIG. 12(b) is produced by laminating an Fe—Ni alloy sheet 21 and a Cu-group metal sheet 22 and winding the resultant laminate around a solid circular Fe—Ni alloy column 101 (step (a)); inserting the resultant assembly into a hollow Cu-group metal cylinder 103 (step (b));

welding lids 35 to the cylinder 103 (step (c)); hot-extruding the welded body to provide a heat spreader shown in FIG. 12(b). Also, by mounting a thin titanium cylinder around the columnar assembly 34, or by hot-extruding the columnar assembly 34 after covered and welded with a thin titanium sheet, a composite heat spreader provided with a titanium surface layer can be produced.

The heat spreader shown in FIG. 13 may be produced in the same manner as shown in FIG. 20. Specifically, an Fe—Ni alloy body in the shape of a rectangular parallelepiped is sandwiched by Cu-group metal bodies on both sides, with optional titanium sheets attached to both sides thereof. The resultant assembly is subjected to hot isostatic pressing to produce a slab as shown in FIGS. 20(b), (c), and the slab is rolled by rolls oriented perpendicularly to the boundaries of the sheets as shown in FIG. 20(d) and cut to a desired shape.

The methods of the present invention can produce beat spreaders of desired shapes and sizes stably at a high precision on a commercial production scale, with a thermal conductivity and a thermal expansion coefficient thereof controlled to desired levels.

The present invention will be explained in more detail by reference to the following examples, without intending to limit the scope of the present invention to them.

EXAMPLES 1–8 AND COMPARATIVE EXAMPLES 1–6

By the method of the present invention shown in FIG. 20, 0.15-mm-thick sheets 21 of a 36% Ni—Fe alloy and 0.2-mm-thick Cu sheets 22 were alternatingly stacked and introduced into a capsule 41 made of steel. Ater evacuation and sealing, the capsule 41 was hot isostatic-pressed at 900° C. and 1200 atms for 2 hours to produce a slab 30. The slab 30 was cut to 10 mm in thickness and 300 mm in width. The cut slab 30 was rolled by rolls 44 disposed such that their axises were oriented perpendicularly to the stripe direction of the slab 30, thereby producing a 1.5-mm-thick integrated stripe-pattern laminate 38. The rolled stripe-pattern laminate 38 had substantially the same stripe interval d and width a, b of each sheet as those before rolling. A heat spreader was cut from the rolled stripe-pattern laminate 38.

The heat spreader was measured with respect to a thermal conductivity and a thermal expansion coefficient between 0°C. and 700° C. in parallel and perpendicular directions to the stripe direction of the heat spreader. A thermal conductivity and a thermal expansion coefficient was also measured on the heat spreaders produced by the same method as above except for changing the Ni amount of the Fe—Ni alloy, the composition of Cu-group metal, the stripe interval d, the width a of each Fe—Ni alloy sheet and the width b of each Cu-group metal sheet.

Each heat spreader thus produced was assembled in a plastic package shown in FIG. 2 to measure a solder fatigue by a T cycle heat hysteresis test at −55° C. to +150° C., peeling of the resin by a reflow resistance test, and heat dissipation by a heat resistance test. Evaluations of these items were carried out by the following standards. The results are shown in Table 1.

(1) T cycle heat hysteresis test (solder fatigue)

⊚: No solder fatigue,

○: Little solder fatigue,

Δ: Relatively large solder fatigue, and

X: Large solder fatigue.

(2) Reflow resistance test (peeling of resin)

Peeling of the resin was measured with or without a titanium cover.

⊚: No peeling,

○: Slight peeling,

Δ: Relatively large peeling, and

X: Large peeling.

(3) Heat resistance test (heat dissipation)

Heat dissipation was measured.

○: Excellent heat dissipation,

⊚: Good heat dissipation,

Δ: Fair heat dissipation, and

X: Poor heat dissipation.

TABLE 1

| | Composition | | | Dimension (mm) | | |
|---|---|---|---|---|---|---|
| No. | Fe—Ni Alloy | Cu-Group Metal | Others | d | a | b |
| Example | | | | | | |
| 1 | 36% Ni | Pure Cu | — | 0.35 | 0.15 | 0.2 |
| 2 | 36% Ni | Pure Cu | — | 2.0 | 0.8 | 1.2 |
| 3 | 36% Ni | Pure Cu | — | 2.2 | 1.0 | 1.2 |
| 4 | 36% Ni | Pure Cu | — | 0.4 | 0.2 | 0.2 |
| 5 | 36% Ni | Pure Cu | — | 0.4 | 0.2 | 0.2 |
| 6 | 42% Ni | Pure Cu | — | 0.35 | 0.15 | 0.2 |
| 7 | 36% Ni | Cu + 2% P | — | 0.35 | 0.15 | 0.2 |
| 8 | 36% Ni | Pure Cu | — | 0.35 | 0.15 | 0.2 |
| Comparative Example | | | | | | |
| 1 | 36% Ni | — | — | — | — | — |
| 2 | 42% Ni | — | — | — | — | — |
| 3 | — | Pure Cu | — | — | — | — |
| 4 | — | — | Mo | — | — | — |

TABLE 1-continued

| No. | | | | | Solder Fatigue | Reflow Resistance Test | | Heat Resistance |
|---|---|---|---|---|---|---|---|---|
| 5 | — | — | Si | — | — | — | — | |
| 6 | — | — | $Al_2O_3$ | — | — | — | — | |

| No. | Thermal Expansion Coefficient[1] | | Thermal Conductivity[2] | | Solder Fatigue | Reflow Resistance Test | | Heat Resistance |
|---|---|---|---|---|---|---|---|---|
| | Parallel[3] | Perpen.[4] | Parallel[3] | Perpen.[4] | | With Ti | Without Ti | |
| Example | | | | | | | | |
| 1 | 6–7 | 9–10 | 180 | 160 | ○ | ◉ | Δ | ○ |
| 2 | 6–7 | 9–10 | 180 | 160 | ○ | ◉ | Δ | ○ |
| 3 | 6–7 | 9–10 | 180 | 160 | Δ | Δ | Δ | Δ |
| 4 | 6–7 | 9–10 | 170 | 150 | ◉ | — | Δ | ○ |
| 5[5] | 6–7 | 6–7 | 170 | 170 | ◉ | — | ◉ | ○ |
| 6 | 7.5–8 | 12 | 180 | 160 | Δ | ◉ | Δ | ○ |
| 7 | 6–7 | 9–10 | 130 | 110 | ○ | ◉ | Δ | ○ |
| 8[6] | 6–7 | 6–7 | 180 | 180 | ◉ | — | ○ | ○ |
| Comparative Example | | | | | | | | |
| 1 | 1.5 | | 17 | | — | — | Δ | x |
| 2 | 5.5 | | 17 | | — | — | ○ | x |
| 3 | 17 | | 393 | | x | — | x | ◉ |
| 4 | 5–7 | | 130 | | ○ | — | — | Δ |
| 5 | 3.2 | | 80* | | — | — | — | — |
| 6 | 5–7 | | — | | — | — | — | — |

Note
[1]Unit: × $10^{-6}$/° C.
[2]Unit: W/mK.
[3]Parallel to the stripe direction.
[4]Perpendicular to the stripe direction.
[5]Example 5 represents a stepped composite laminate ($t_1/t_2$ = 1/1.5, $t_1 + t_2$ = 1.5 mm).
[6]Example 8 represents a composite laminate ($t_1 = t_2$, $t_1 + t_2$ = 1.5 mm).
*About 80.

Example 5 is a stepped composite heat spreader composed of two integrated stripe-pattern laminates in which $t_1/t_2$=1/1.5, $t_1+t_2$=1.5 mm. Example 8 is a composite heat spreader composed of two integrated stripe-pattern laminates in which $t_1=t_2$, and $t_1+t_2$=1.5 mm. In both of Examples 5 and 8, two integrated stripe-pattern laminates were bonded together in a manner shown in FIGS. 20(e) and (g), and each heat spreader was covered by a plastic package as shown in FIG. 15.

The heat spreaders of Examples do not suffer from failure and damage in chips, resins and solders and are free from peeling between the Fe—Ni alloy sheets and the Cu-group metal sheets. With respect to Example 3, in which d is outside the range of 0.1–2.0 mm, α is outside the range of 0.05–1.0 mm, and b is outside the range of 0.05–1.0 mm, there are solder fatigue, resin peeling and insufficient heat dissipation because d is too large, though these problems are tolerable for some packages. With respect to the composite laminates of Examples 5 and 8, the thermal conductivity and the thermal expansion coefficient are free from anisotropy, providing good results stably.

EXAMPLE 7

A Cu-covered integrated stripe-pattern laminate 138 was produced by the method shown in FIG. 21. In the step (a), 0.15-mm-thick sheets 21 of an 36% Ni—Fe alloy and 0.2-mm-thick sheets 22 made of pure copper (commercially available) were used. A steel pipe 50 of a rectangular cross section was 10 mm in thickness, 350 mm×350 mm in outer size and 1500 m in length. The steel pipe 50 was lined with a 10-mm-thick Cu sheet, and an alternate laminate of the above sheets was introduced into the steel pipe 50. A lid 35 composed of an outer steel layer 51 and an inner copper layer 52 was welded to each opening of the steel pipe 50 to provide a capsule 41, which was then evacuated as shown in FIG. 21(b). The sheets were bonded together by HIP at 900° C. and 1200 atms for 2 hours. The outer steel layer 51 was removed from the HIPed capsule 41 to provide a slab 30 composed of the Fe—Ni alloy sheets 21 and the Cu sheets 22 as shown in FIG. 21(c). The slab 30 was rolled by rolls disposed perpendicular to the stripe direction as shown in FIG. 20(d) to produce an integrated composite stripe-pattern laminate 138 covered by a copper sheet layer as shown in FIG. 21(d).

Two integrated stripe-pattern laminates 38 were stacked and bonded together by Ag brazing such that their stripe directions were perpendicular to each other. The resultant integrated composite laminate was cut to 20 mm×20 mm to provide a composite heat spreader, which was then plated with Ag. As shown in FIG. 8(b), a silicon chip 1 was die-bonded to the composite heat spreader by a bonding material layer 6 made of an Au—Si eutectic alloy. With $t_1/t_2$ varying within the range of $t_1+t_2$ from 1.5 mm to 2 mm, the cracking of the silicon chip 1 was observed. Also, after molding with a resin, a T cycle heat hysteresis test was conducted at a temperature from −55° C. to +150° C. to observe whether the silicon chip 1 was cracked or not. The results are shown in Table 2. In Table 2, the number of samples whose silicon chip 1 was cracked is expressed by a numerator in a fractional expression in which a denominator (10) indicates the number of samples tested.

TABLE 2

| $t_1/t_2$ | 1/0.5 | 1/1.0 | 1/1.5 | 1/2.0 | 1/2.5 | 1/3.0 | 1/3.5 |
|---|---|---|---|---|---|---|---|
| Die Bonding* | 5/10 | 1/10 | 0/10 | 0/10 | 0/10 | 0/10 | 0/10 |
| T Cycle Test* | 2/10 | 1/10 | 0/10 | 0/10 | 0/10 | 0/10 | 3/10 |

Note *: Number of samples with cracks/number of samples tested.

As is clear from Table 2, no cracks were generated in the silicon chip 1 in the range of $t_1/t_2 = 1/1.5 – 1/3$, while cracks were observed outside the above range.

EXAMPLE 8

Figure 25A:
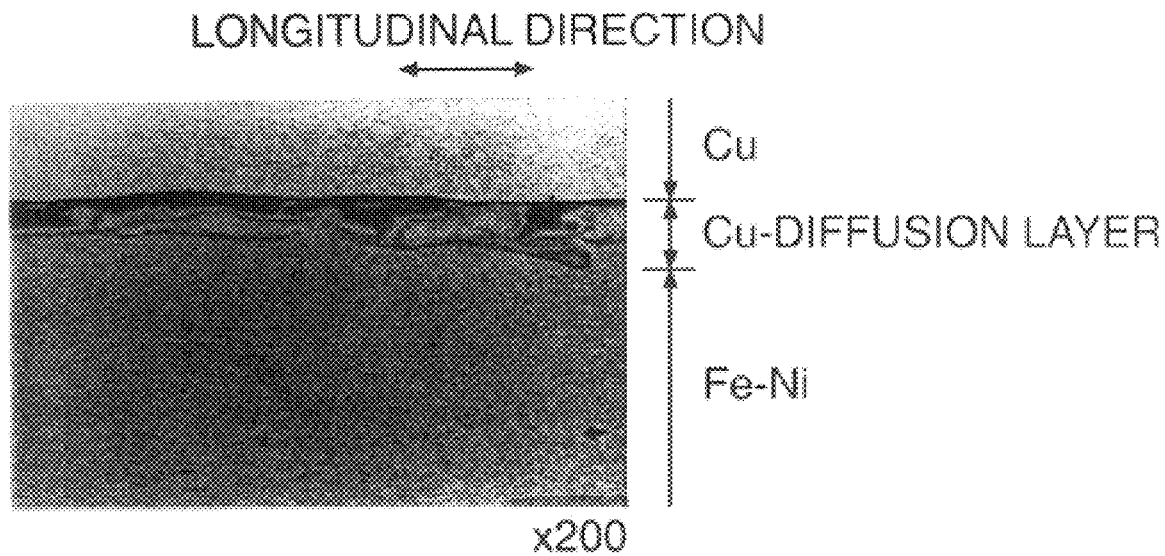
FIG. 25(a) is an optical photomicrograph (×200) of the bonding boundary between the Fe—Ni alloy and the pure Cu in a longitudinal direction (rolling direction)
Figure 25B:
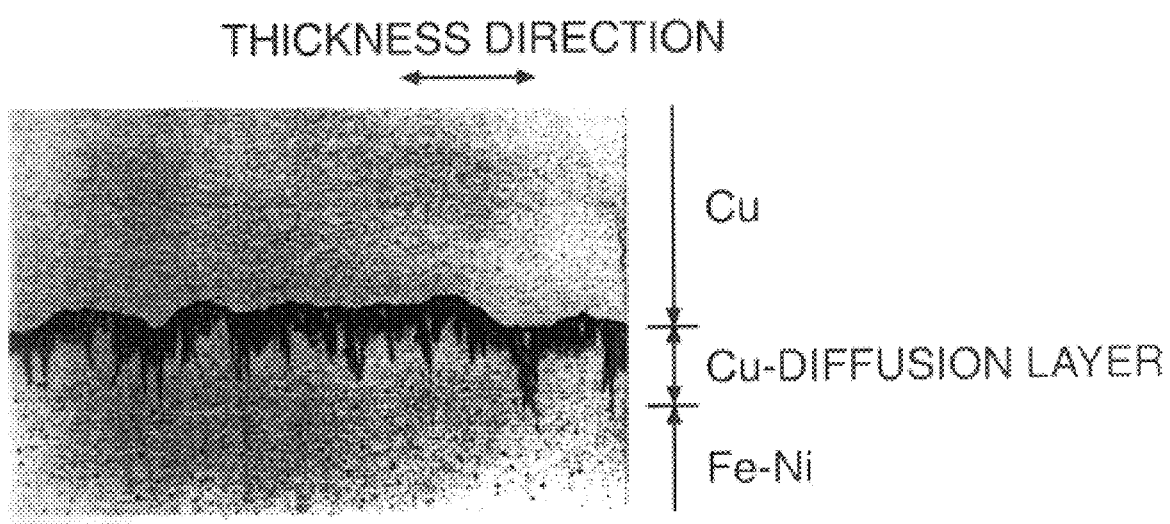
FIG. 25(b) is an optical photomicrograph (×200) of the bonding boundary between the Fe—Ni alloy and the pure Cu in a transverse direction (perpendicular to the rolling direction).

Stripe-pattern laminated metal bodies produced in the same manner as in Example 1 from 0.15-mm-thick sheets 21 of 36% Ni—Fe alloy and 0.2-mm-thick pure Cu sheets 22 were observed by an optical microscope. FIG. 25 is an optical photomicrograph (×200) of the bonding boundary between the 36% Ni–Fe alloy and the pure Cu.

As is clear from FIG. 25, Cu is diffused into the Fe—Ni alloy. Such a diffusion region is indispensable to achieve a highly reliable integrated laminate for a heat spreader. Therefore, the hot isostatic pressing is combined with the rolling in the present invention.

Since the heat spreader of the present invention is composed of an integrated stripe-pattern laminate of Fe—Ni alloy sheets and Cu-group metal sheets, with Cu-group metal sheets penetrating from a chip-mounting surface to an opposite surface, it is excellent in heat dissipation. Moreover, by adjusting the ratio of the Fe—Ni alloy sheets to the Cu-group metal sheets, it is possible to control the thermal conductivity of the heat spreader to a desired level, while simultaneously keeping the thermal expansion coefficient of th heat spreader close to that of Si. Accordingly, even though higher integration of the silicon chip generates more heat in a semiconductor device, excellent heat dissipation can be achieved, avoiding such troubles as deformation, breakage and peeling of the silicon chip from the heat spreader due to differences in thermal expansion coefficient therebetween. Also, since the Fe—Ni alloy is well bondable with a resin, the peeling and cracking of the resin can be prevented in the plastic package containing the heat spreader of the present invention. Further, since the heat spreader of the present invention has a thermal expansion coefficient close to those of ceramics, thermal strain can also be avoided in the ceramic packages.

Since the semiconductor device of the present invention comprises such a heat spreader, it is excellent in heat dissipation, suitable for higher integration of circuit on a silicon chip, providing higher reliability with lower defects.

Further, since the method of the present invention utilizes such known steps as hot isostatic pressing, rolling and hot extrusion, it is possible to stably produce a heat spreader at a high precision on a commercial production scale.

What is claimed is:

1. A method for producing a heat spreader for a semiconductor device comprising the steps of (a) alternatingly stacking Fe—Ni alloy sheets and copper-group metal sheets, (b) hot isostatic-pressing the resulting stack of said metal sheets to form a slab, (c) rolling said slab vertically to the laminating direction of said metal sheets to form an integrated stripe-pattern laminate, and (d) cutting said integrated stripe-pattern laminate to a predetermined shape.

2. The method for producing a heat spreader for a semiconductor device according to claim 1, wherein a laminate of alternatingly stacked Fe—Ni alloy sheets and copper-group metal sheets is inserted into a capsule constituted by an outer steel wall and an inner Cu wall and subjected to hot isostatic pressing, followed by the removal of said outer steel wall from the resultant hot isostatic-pressed capsule to provide a slab covered by a copper layer.

3. The method for producing a heat spreader for a semiconductor device according to claim 1, comprising the steps of cutting said slab to a rectangular parallelepiped shape, stacking two or more cut slabs with their stripe directions perpendicular to each other, subjecting the stacked slabs to hot isostatic pressing again to form a composite slab, rolling said composite slab vertically to the laminating direction of one slab to form an integrated composite laminate, and cutting said integrated composite laminate to a predetermined shape.

4. The method for producing a heat spreader for a semiconductor device according to claim 1, wherein two or more rolled stripe-pattern laminates are stacked with their stripe directions perpendicular to each other and bonded together by hot pressing or brazing, and cut to a predetermined shape.

5. A method for producing a heat spreader for a semiconductor device comprising the steps of stacking a Cu-group metal body to each side surface of an Fe—Ni alloy body in the shape of a rectangular parallelepiped, hot isostatic pressing the resultant stack of said Fe—Ni alloy body and said Cu-group metal body to provide a slab, rolling said slab vertically to the laminating direction of said slab, and cutting the resultant integrated laminate to a predetermined shape.

* * * * *